US012284850B2

(12) United States Patent
Bohmer et al.

(10) Patent No.: US 12,284,850 B2
(45) Date of Patent: Apr. 22, 2025

(54) LATERALLY HETEROGENOUS WAVELENGTH-CONVERTING LAYER

(71) Applicant: LUMILEDS LLC, San Jose, CA (US)

(72) Inventors: Marcel Rene Bohmer, Eindhoven (NL); Toni Lopez, Aachen (DE); Ken Shimizu, Sunnyvale, CA (US)

(73) Assignee: Lumileds LLC, San Jose, CA (US)

( * ) Notice: Subject to any disclaimer, the term of this patent is extended or adjusted under 35 U.S.C. 154(b) by 512 days.

(21) Appl. No.: 17/537,919

(22) Filed: Nov. 30, 2021

(65) Prior Publication Data
US 2022/0173284 A1 Jun. 2, 2022

Related U.S. Application Data

(60) Provisional application No. 63/119,976, filed on Dec. 1, 2020.

(51) Int. Cl.
| | |
|---|---|
| *H10H 20/851* | (2025.01) |
| *H10H 20/01* | (2025.01) |
| *H10H 29/14* | (2025.01) |

(52) U.S. Cl.
CPC ...... *H10H 20/8516* (2025.01); *H10H 29/142* (2025.01); *H10H 20/0361* (2025.01)

(58) Field of Classification Search
CPC ... H01L 33/508; H01L 27/153; H01L 27/156; H01L 2933/0041; H01L 2933/0091; H01L 25/0753; H01L 33/504; H10K 50/854; H10H 20/812; H10H 20/8516; H10D 84/858; H10F 77/122
See application file for complete search history.

(56) References Cited

U.S. PATENT DOCUMENTS

| | | | |
|---|---|---|---|
| 9,935,249 B2 | 4/2018 | Tanaka | |
| 10,473,271 B2 | 11/2019 | Jiang et al. | |
| 10,836,958 B2 | 11/2020 | Nakamura et al. | |
| 2014/0339495 A1* | 11/2014 | Bibl | H10H 29/142 257/13 |
| 2017/0250316 A1 | 8/2017 | Yeon et al. | |

(Continued)

FOREIGN PATENT DOCUMENTS

| | | |
|---|---|---|
| EP | 3457021 A1 | 3/2019 |
| JP | 2013-247067 A | 12/2013 |

(Continued)

OTHER PUBLICATIONS

The extended European search report, EP application No. 21901370.3, Jun. 28, 2024, 9 pages.

(Continued)

*Primary Examiner* — Moazzam Hossain

(57) ABSTRACT

A laterally heterogenous wavelength-converting optical element includes pixel regions surrounded by border regions; each includes down-converting phosphor particles bound by a coating or solid medium. The pixel regions are aligned with LEDs of an array. The phosphor regions differ with respect to one or more of compositions, particle sizes, coating thicknesses, refractive indices, or voids (size, number density, or volume fraction). Those difference(s) can result in the border regions exhibiting larger optical scattering, which can improve contrast of down-converted light emitted by adjacent pixels of the array.

20 Claims, 12 Drawing Sheets

(56) References Cited

U.S. PATENT DOCUMENTS

| | | |
|---|---|---|
| 2018/0033920 A1 | 2/2018 | Steltenpol et al. |
| 2019/0198720 A1 | 6/2019 | Chamberlin et al. |
| 2020/0212100 A1 | 7/2020 | Masui et al. |
| 2020/0212270 A1 | 7/2020 | Bohmer et al. |

FOREIGN PATENT DOCUMENTS

| | | |
|---|---|---|
| JP | 2016-219675 A | 12/2016 |
| JP | 2019-152851 A | 9/2019 |
| KR | 2017-0123644 A | 11/2017 |
| KR | 2018-0081378 A | 7/2018 |
| WO | 2016/124632 A1 | 8/2016 |
| WO | 2017/179521 A1 | 10/2017 |
| WO | 2017/195620 A1 | 11/2017 |

OTHER PUBLICATIONS

From the Korean Intellectual Property Office as the ISA, "Notification of the Transmittal of the International Search Report and Written Opinion on the International Searching Authority, or the Declaration", PCT/US2021/061372, Mar. 28, 2022, 12 pages.

\* cited by examiner

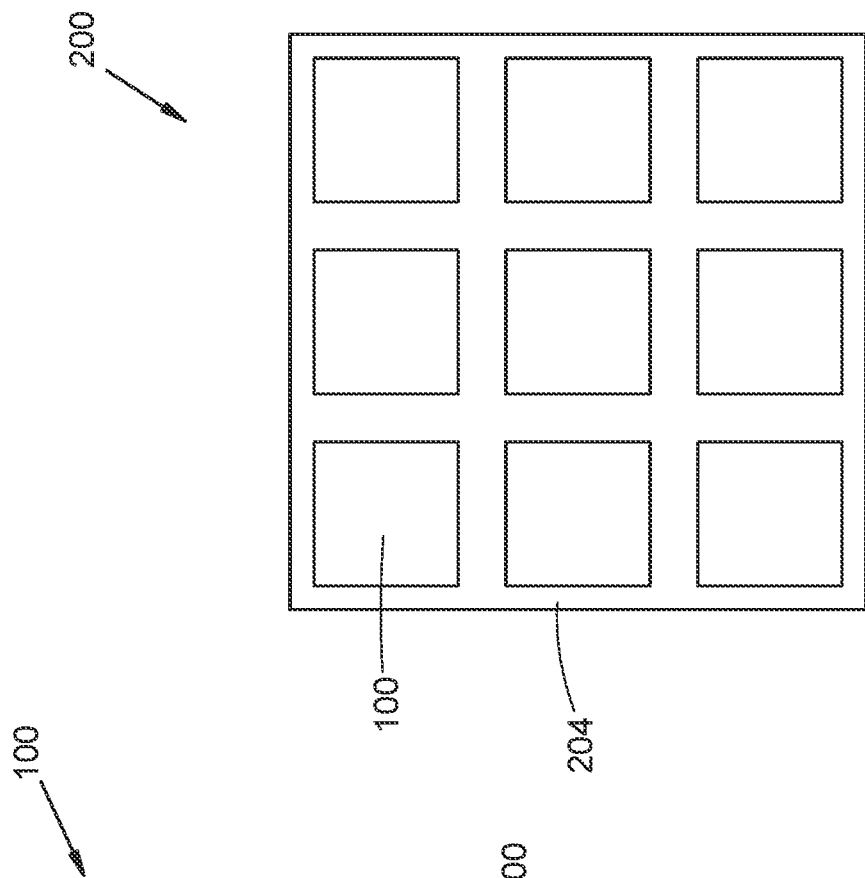
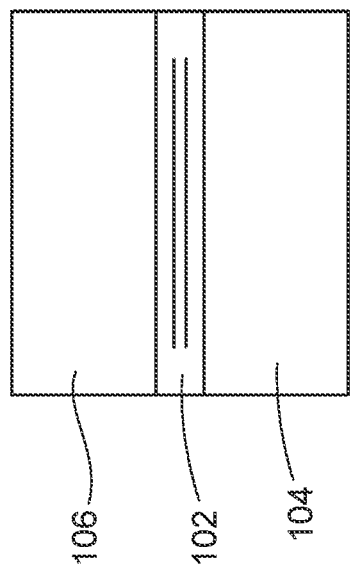
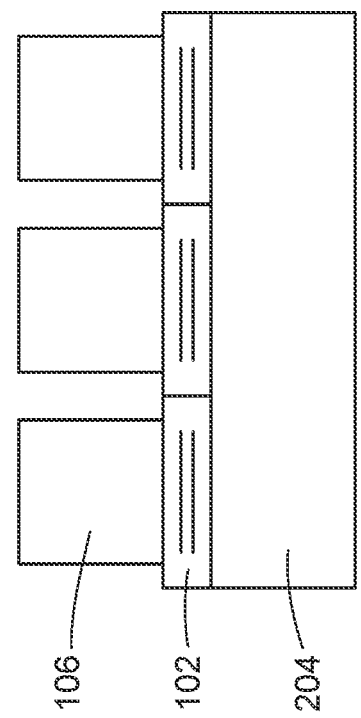
FIG. 1
FIG. 2A
FIG. 2B

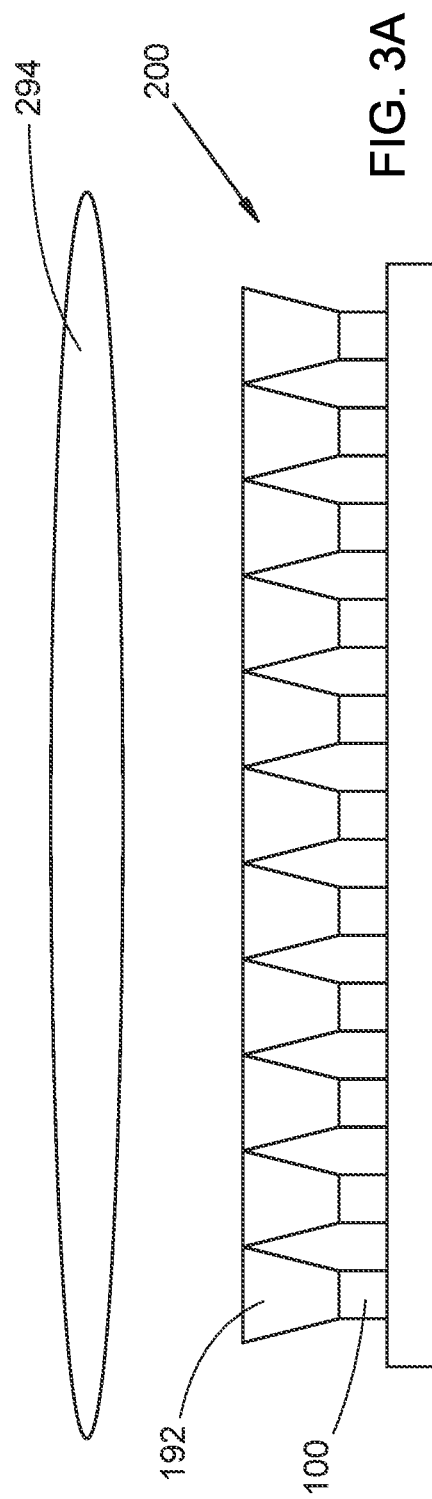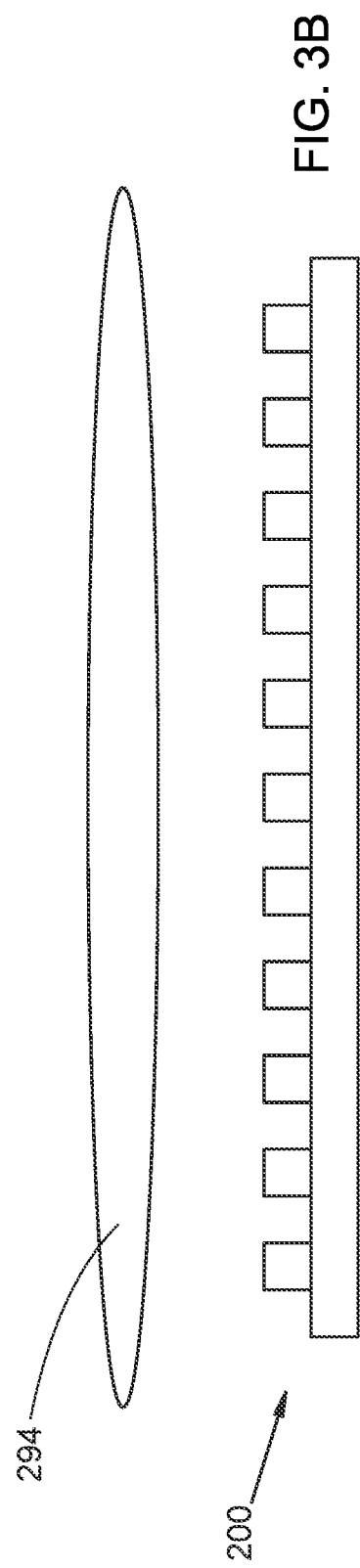

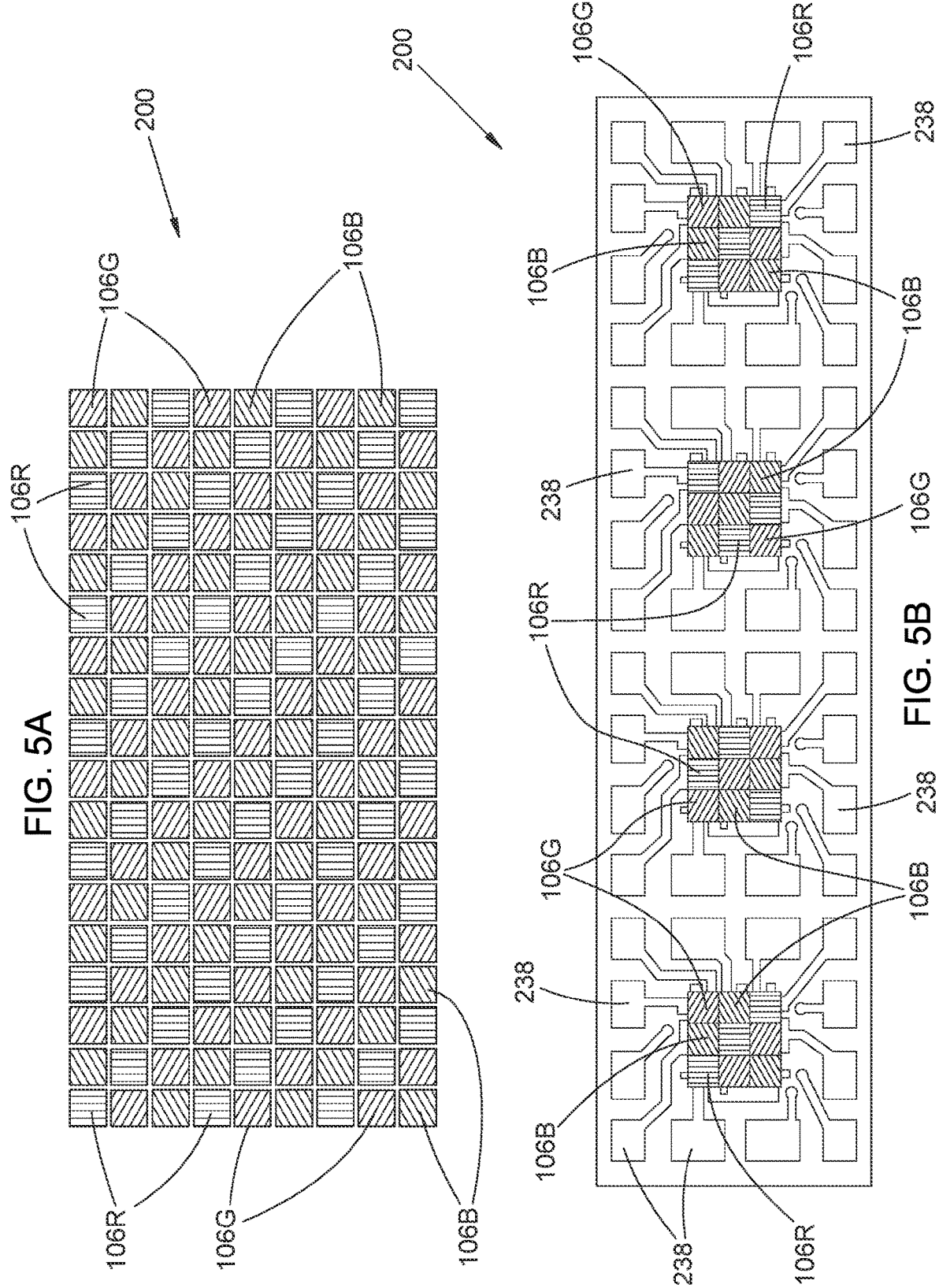

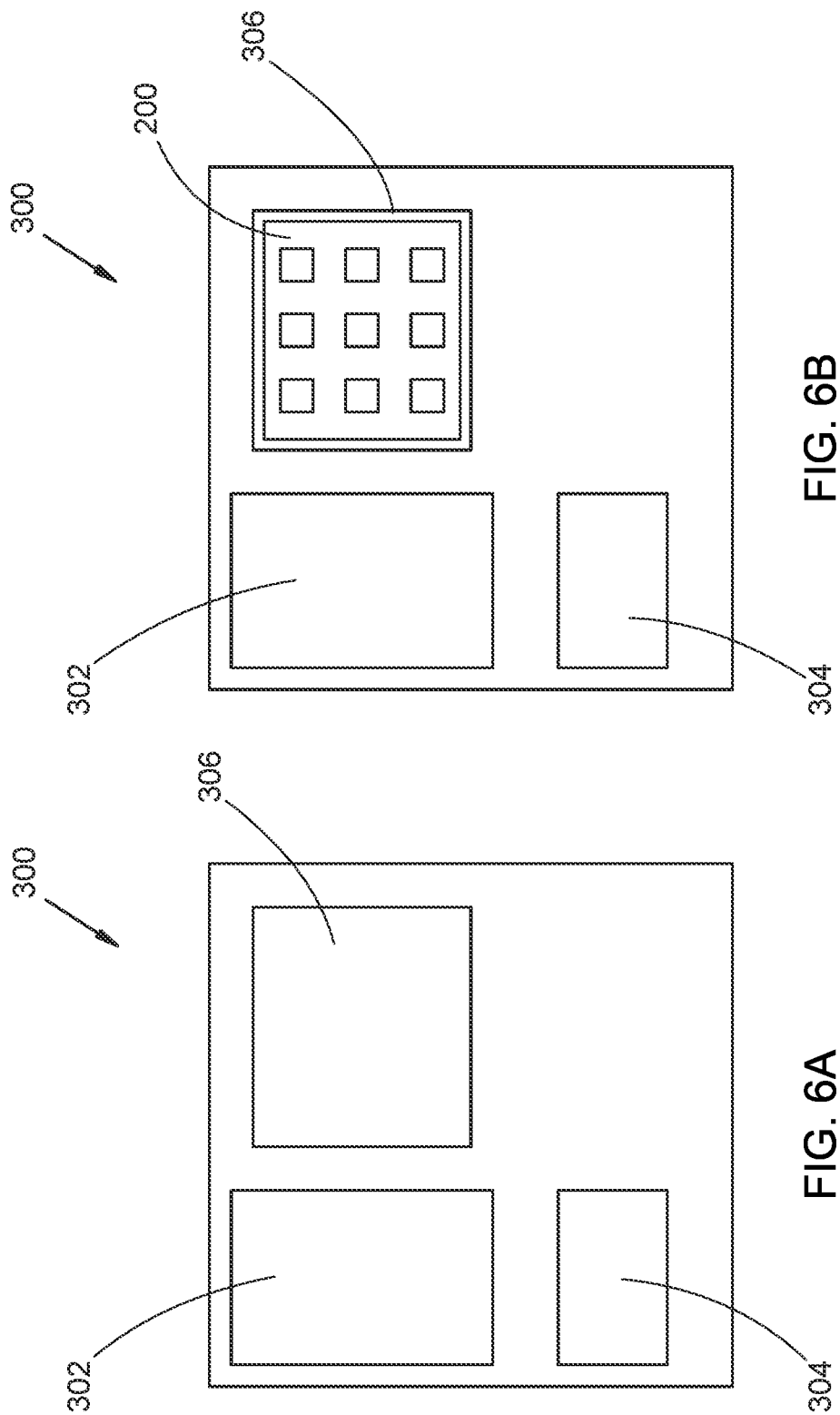

LATERALLY HETEROGENOUS WAVELENGTH-CONVERTING LAYER

BENEFIT CLAIM

This application claims benefit of U.S. provisional App. No. 63/119,976 entitled "Laterally heterogeneous conversion layers" filed Dec. 1, 2020 in the names of Bohmer et al; said provisional application is incorporated herein by reference in its entirety.

FIELD OF THE INVENTION

The invention relates generally to light emitting diodes and to phosphor-converted light emitting diodes.

BACKGROUND

Semiconductor light emitting diodes and laser diodes (collectively referred to herein as "LEDs") are among the most efficient light sources currently available. The emission spectrum of an LED typically exhibits a single narrow peak at a wavelength determined by the structure of the device and by the composition of the semiconductor materials from which it is constructed. By suitable choice of device structure and material system, LEDs may be designed to operate at ultraviolet, visible, or infrared wavelengths.

LEDs may be combined with one or more wavelength converting materials (generally referred to herein as "phosphors") that absorb light emitted by the LED and in response emit light of a longer wavelength. For such phosphor-converted LEDs ("pcLEDs"), the fraction of the light emitted by the LED that is absorbed by the phosphors depends on the amount of phosphor material in the optical path of the light emitted by the LED, for example on the concentration of phosphor material in a phosphor layer disposed on or around the LED and the thickness of the layer.

Phosphor-converted LEDs may be designed so that all of the light emitted by the LED is absorbed by one or more phosphors, in which case the emission from the pcLED is entirely from the phosphors. In such cases the phosphor may be selected, for example, to emit light in a narrow spectral region that is not efficiently generated directly by an LED.

Alternatively, pcLEDs may be designed so that only a portion of the light emitted by the LED is absorbed by the phosphors, in which case the emission from the pcLED is a mixture of light emitted by the LED and light emitted by the phosphors. By suitable choice of LED, phosphors, and phosphor composition, such a pcLED may be designed to emit, for example, white light having a desired color temperature and desired color-rendering properties.

Multiple LEDs or pcLEDs can be formed together on a single substrate to form an array. Such arrays can be employed to form active illuminated displays, such as those employed in, e.g., smartphones and smart watches, computer or video displays, augmented- or virtual-reality displays, or signage, or to form adaptive illumination sources, such as those employed in, e.g., automotive headlights, street lights, camera flash sources, or flashlights (i.e., torches). An array having one or several or many individual devices per millimeter (e.g., device pitch or spacing of about a millimeter, a few hundred microns, or less than 100 microns, and separation between adjacent devices less than 100 microns or only a few tens of microns or less) typically is referred to as a miniLED array or a microLED array (alternatively, a µLED array). Such mini- or microLED arrays can in many instances also include phosphor converters as described above; such arrays can be referred to as pc-miniLED or pc-microLED arrays.

SUMMARY

A wavelength-converting optical element comprises a solid material layer having opposite first and second surfaces and comprising a plurality of discrete pixel regions and intervening border regions. The border regions at least partly surround each one of the pixel regions and at least partly separate each pixel region from adjacent pixel regions.

For each pixel region, the optical element includes a corresponding plurality of pixel phosphor particles and a transparent pixel binder. The pixel binder can include either (i) a transparent pixel coating at least partly coating each pixel phosphor particle and binding them together within each pixel region while leaving voids among the bound pixel phosphor particles, or (ii) a transparent solid pixel medium substantially filling each pixel region in which the pixel phosphor particles are embedded. In the border regions, the optical element includes a plurality of border phosphor particles and a transparent border binder. The border binder can include either (i) a transparent border coating at least partly coating each border phosphor particle and binding them together while leaving voids among the bound border phosphor particles, or (ii) a transparent solid border medium substantially filling the border regions in which the border phosphor particles are embedded.

The pixel regions differing from the border regions with respect to one or more of: (i) differing sizes, compositions, or refractive indices characterizing the pixel phosphor particles and the border phosphor particles, (ii) differing thicknesses, compositions, or refractive indices characterizing the pixel coating and the border coating, (iii) differing size or number density characterizing voids among the pixel phosphor particles and among the border phosphor particles, or (iv) differing compositions or refractive indices characterizing the solid pixel medium and the solid border medium. In that way the border regions can exhibit optical scattering of light emitted by the pixel or border phosphor particles that is greater than that optical scattering exhibited by the pixel regions.

A light-emitting device can incorporate the wavelength-converting optical element in combination with an array of semiconductor light-emitting pixels that emit light at a first wavelength. Spacing of the light-emitting pixels can match spacing of the pixel regions of wavelength-converting optical element. Light emitted by the light-emitting pixels enters the first surface of the wavelength-converting optical element and is at least partly absorbed by the pixel phosphor particles and the border phosphor particles, resulting in emission from those phosphor particles of down-converted light at one or more down-converted wavelengths longer than the first wavelength. The wavelength-converting optical element can be positioned so that the pixel regions are substantially aligned with the light-emitting pixels of the array. The increased optical scattering exhibited by the border regions can enhance a contrast ratio between down-converted light emitted by adjacent pixels.

Objects and advantages pertaining to LEDs, pcLEDs, miniLED arrays, pc-miniLED arrays, microLED arrays, and pc-microLED arrays may become apparent upon referring to the examples illustrated in the drawings and disclosed in the following written description or appended claims.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

BRIEF DESCRIPTION OF THE DRAWINGS

FIG. 1 shows a schematic cross-sectional view of an example pcLED.

FIGS. 2A and 2B show, respectively, cross-sectional and top schematic views of an example array of pcLEDs.

FIG. 3A shows a schematic cross-sectional view of an example array of pcLEDs arranged with respect to waveguides and a projection lens. FIG. 3B shows an arrangement similar to that of FIG. 3A, but without the waveguides.

FIG. 5A is a schematic top view of a portion of an example LED display in which each display pixel is a red, green, or blue phosphor-converted LED pixel. FIG. 5B is a schematic top view of a portion of an example LED display in which each display pixel includes multiple phosphor-converted LED pixels (red, green, and blue) integrated onto a single die that is bonded to a control circuit backplane.

FIG. 6A shows a schematic top view an example electronics board on which an array of pcLEDs may be mounted, and FIG. 6B similarly shows an example array of pcLEDs mounted on the electronic board of FIG. 6A.

Figure 4A:
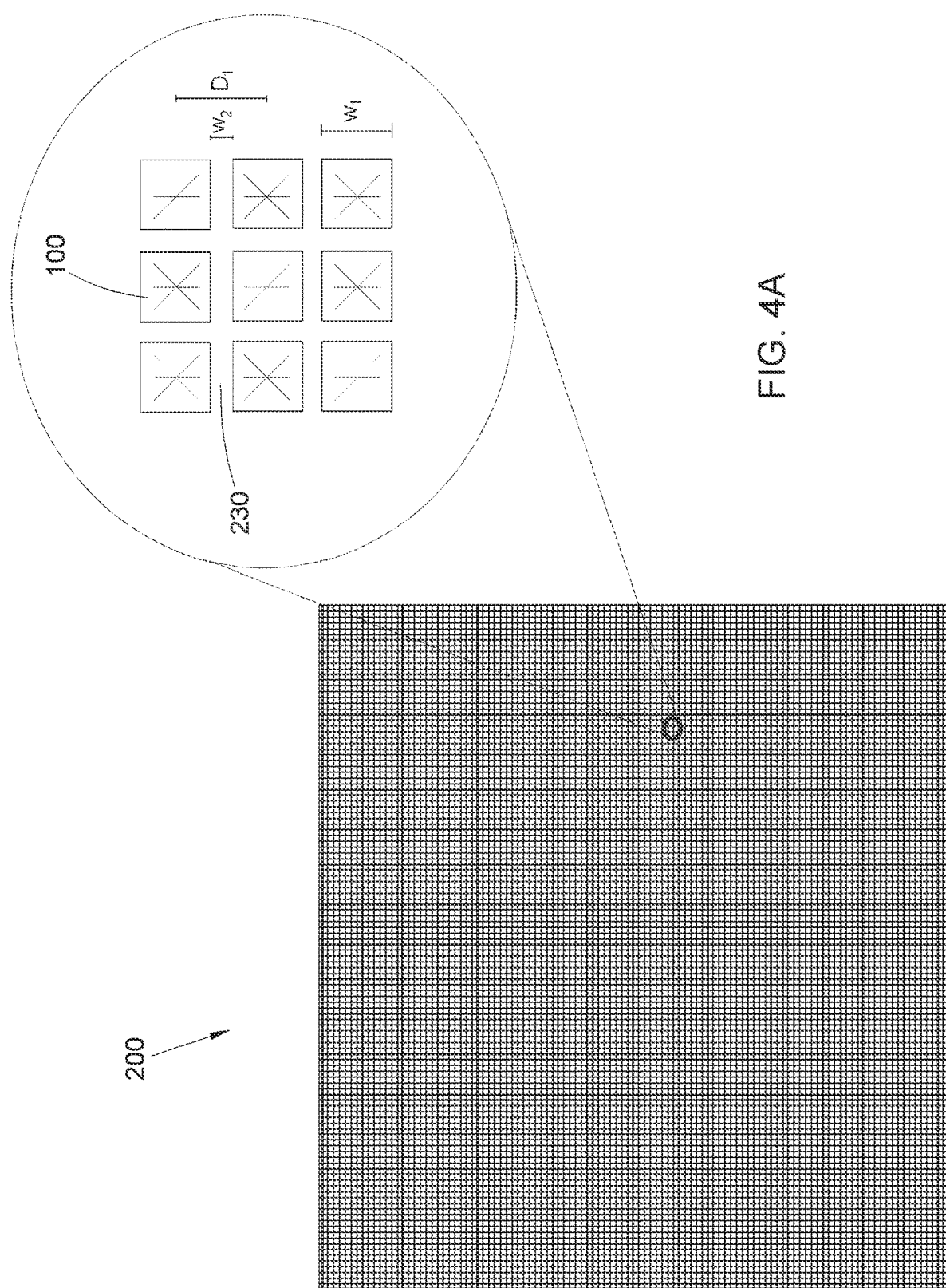
FIG. 4A shows a top schematic view of an example miniLED or microLED array and an enlarged section of 3×3 LEDs of the array.

The examples depicted are shown only schematically; all features may not be shown in full detail or in proper proportion; for clarity certain features or structures may be exaggerated or diminished relative to others or omitted entirely; the drawings should not be regarded as being to scale unless explicitly indicated as being to scale. For example, individual LEDs may be exaggerated in their vertical dimensions or layer thicknesses relative to their lateral extent or relative to substrate or phosphor thicknesses. The examples shown should not be construed as limiting the scope of the present disclosure or appended claims.

DETAILED DESCRIPTION

The following detailed description should be read with reference to the drawings, in which identical reference numbers refer to like elements throughout the different figures. The drawings, which are not necessarily to scale, depict selective examples and are not intended to limit the scope of the invention. The detailed description illustrates by way of example, not by way of limitation, the principles of the invention.

FIG. 1 shows an example of an individual pcLED 100 comprising a semiconductor diode structure 102 disposed on a substrate 104, together considered herein an "LED" or "semiconductor LED", and a wavelength converting structure (e.g., phosphor layer) 106 disposed on the semiconductor LED. Semiconductor diode structure 102 typically comprises an active region disposed between n-type and p-type layers. Application of a suitable forward bias across the diode structure 102 results in emission of light from the active region. The wavelength of the emitted light is determined by the composition and structure of the active region.

The LED may be, for example, a III-Nitride LED that emits blue, violet, or ultraviolet light. LEDs formed from any other suitable material system and that emit any other suitable wavelength of light may also be used. Other suitable material systems may include, for example, III-Phosphide materials, III-Arsenide materials, other binary, ternary, or quaternary alloys of gallium, aluminum, indium, nitrogen, phosphorus, or arsenic, or II-VI materials.

Any suitable phosphor materials may be used for or incorporated into the wavelength converting structure 106, depending on the desired optical output from the pcLED.

FIGS. 2A-2B show, respectively, cross-sectional and top views of an array 200 of pcLEDs 100, each including a phosphor pixel 106, disposed on a substrate 204. Such an array may include any suitable number of pcLEDs arranged in any suitable manner. In the illustrated example the array is depicted as formed monolithically on a shared substrate, but alternatively an array of pcLEDs may be formed from separate individual pcLEDs. Substrate 204 may optionally include electrical traces or interconnects, or CMOS or other circuitry for driving the LED, and may be formed from any suitable materials.

Individual pcLEDs 100 may optionally incorporate or be arranged in combination with a lens or other optical element located adjacent to or disposed on the phosphor layer. Such an optical element, not shown in the figures, may be referred to as a "primary optical element". In addition, as shown in FIGS. 3A and 3B, a pcLED array 200 (for example, mounted on an electronics board) may be arranged in combination with secondary optical elements such as waveguides, lenses, or both for use in an intended application. In FIG. 3A, light emitted by each pcLED 100 of the array 200 is collected by a corresponding waveguide 192 and directed to a projection lens 294. Projection lens 294 may be a Fresnel lens, for example. This arrangement may be suitable for use, for example, in automobile headlights or other adaptive illumination sources. Other primary or secondary optical elements of any suitable type or arrangement can be included for each pixel, as needed or desired. In FIG. 3B, light emitted by pcLEDs of the array 200 is collected directly by projection lens 294 without use of intervening waveguides. This arrangement may particularly be suitable when pcLEDs can be spaced sufficiently close to each other, and may also be used in automobile headlights as well as in camera flash applications or other illumination sources. A miniLED or microLED display application may use similar optical arrangements to those depicted in FIGS. 3A and 3B, for example. Generally, any suitable arrangement of optical elements (primary, secondary, or both) can be used in combination with the pcLEDs described herein, depending on the desired application.

Although FIGS. 2A and 2B show a 3×3 array of nine pcLEDs, such arrays may include for example on the order of $10^1$, $10^2$, $10^3$, $10^4$, or more LEDs, e.g., as illustrated schematically in FIG. 4A. Individual LEDs 100 (i.e., pixels) may have widths $w_1$ (e.g., side lengths) in the plane of the array 200, for example, less than or equal to 1 millimeter (mm), less than or equal to 500 microns, less than or equal to 100 microns, or less than or equal to 50 microns. LEDs 100 in the array 200 may be spaced apart from each other by streets, lanes, or trenches 230 having a width $w_2$ in the plane of the array 200 of, for example, hundreds of microns, less than or equal to 100 microns, less than or equal to 50 microns, less than or equal to 20 microns, less than or equal to 10 microns, or less than or equal to 5 microns. The pixel pitch or spacing $D_1$ is the sum of $w_1$ and $w_2$. Although the illustrated examples show rectangular pixels arranged in a symmetric matrix, the pixels and the array may have any suitable shape or arrangement, whether symmetric or asymmetric. Multiple separate arrays of LEDs can be combined in any suitable arrangement in any applicable format to form a larger combined array or display.

LEDs having dimensions $w_1$ in the plane of the array (e.g., side lengths) of less than or equal to about 0.10 millimeters microns are typically referred to as microLEDs, and an array of such microLEDs may be referred to as a microLED array. LEDs having dimensions $w_1$ in the plane of the array (e.g., side lengths) of between about 0.10 millimeters and about 1.0 millimeters are typically referred to as miniLEDs, and an array of such miniLEDs may be referred to as a miniLED array.

Figure 4B:
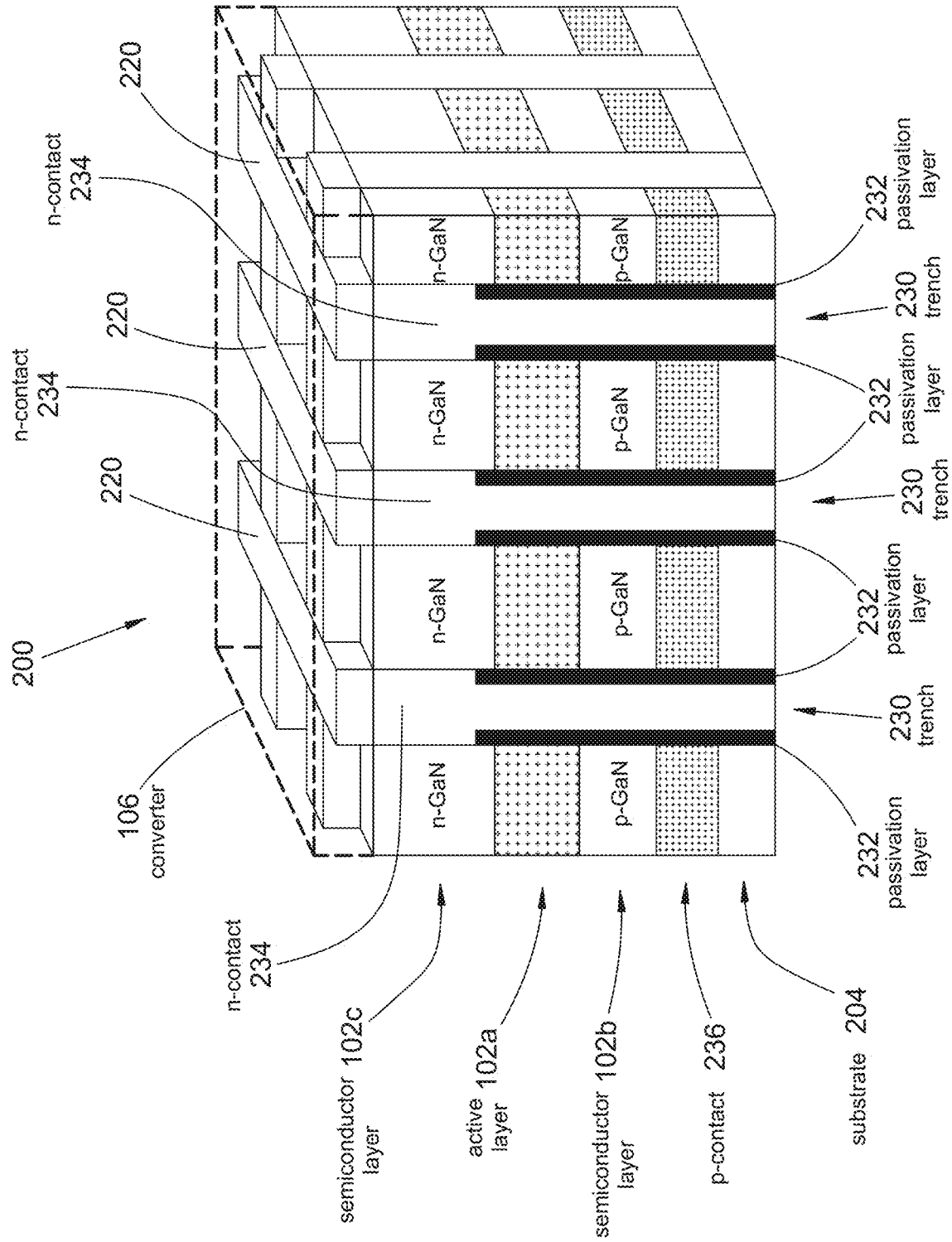
FIG. 4B shows a perspective view of several LEDs of an example pc-miniLED or pc-microLED array monolithically formed on a substrate.

An array of LEDs, miniLEDs, or microLEDs, or portions of such an array, may be formed as a segmented monolithic structure in which individual LED pixels are electrically isolated from each other by trenches and or insulating material. FIG. 4B shows a perspective view of an example of such a segmented monolithic LED array 200. Pixels in this array (i.e., individual semiconductor LED devices 102) are separated by trenches 230 which are filled to form n-contacts 234. The monolithic structure is grown or disposed on the substrate 204. Each pixel includes a p-contact 236, a p-GaN semiconductor layer 102*b*, an active region 102*a*, and an n-GaN semiconductor layer 102*c*; the layers 102*a*/102*b*/102*c* collectively form the semiconductor LED 102. A wavelength converter material 106 may be deposited on the semiconductor layer 102*c* (or other applicable intervening layer). Passivation layers 232 may be formed within the trenches 230 to separate at least a portion of the n-contacts 234 from one or more layers of the semiconductor. The n-contacts 234, other material within the trenches 230, or material different from material within the trenches 230 may extend into the converter material 106 to form complete or partial optical isolation barriers 220 between the pixels.

Figure 4C:
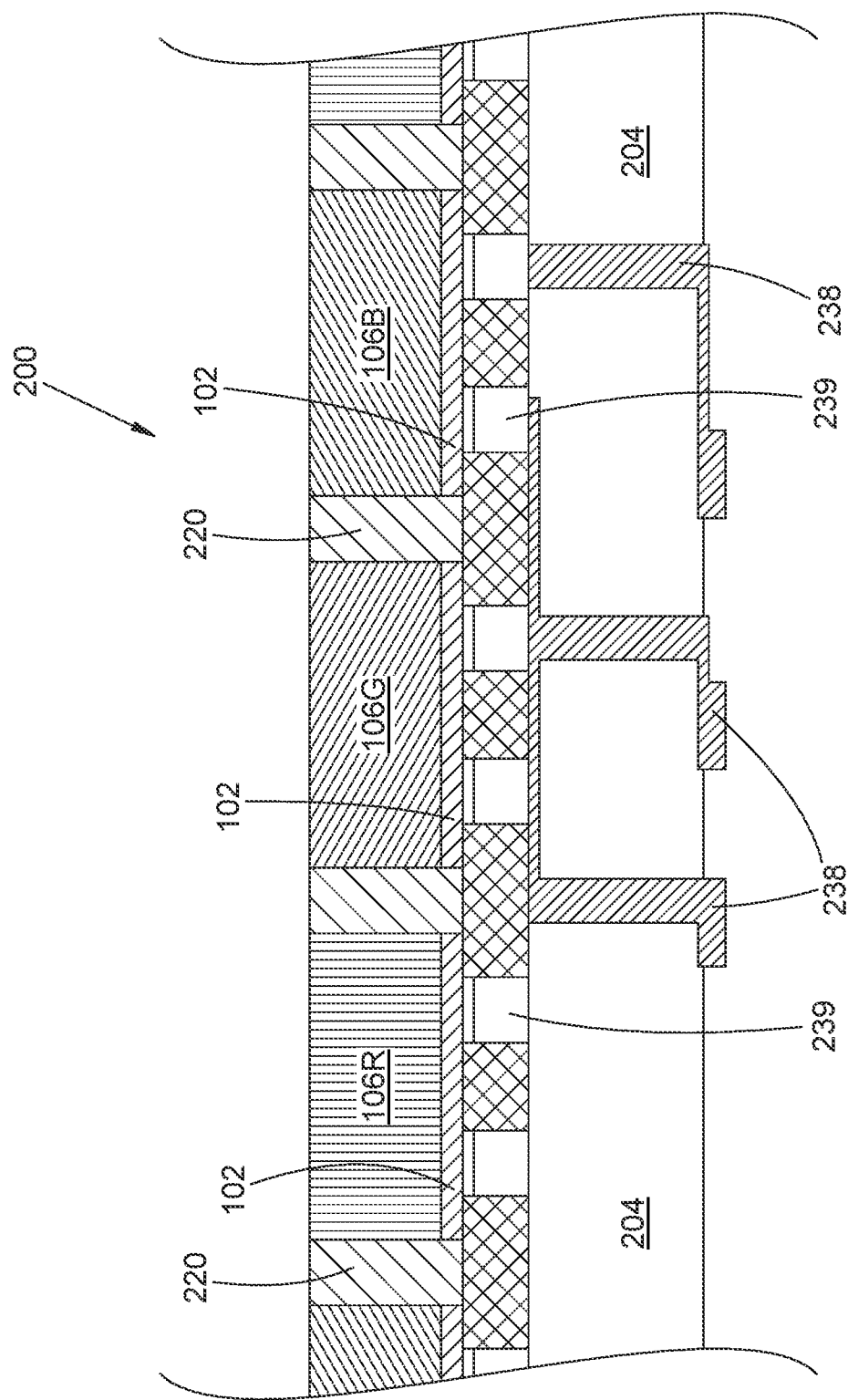
FIG. 4C is a side cross-sectional schematic diagram of an example of a close-packed array of multi-colored phosphor-converted LEDS on a monolithic die and substrate.

FIG. 4C is a schematic cross-sectional view of a close packed array 200 of multi-colored, phosphor converted LEDs 100 on a monolithic die and substrate 204. The side view shows GaN LEDs 102 attached to the substrate 204 through metal interconnects 239 (e.g., gold-gold interconnects or solder attached to copper micropillars) and metal interconnects 238. Phosphor pixels 106 are positioned on or over corresponding GaN LED pixels 102. The semiconductor LED pixels 102 or phosphor pixels 106 (often both) can be coated on their sides with a reflective mirror or diffusive scattering layer to form an optical isolation barrier 220. In this example each phosphor pixel 106 is one of three different colors, e.g., red phosphor pixels 106R, green phosphor pixels 106G, and blue phosphor pixels 106B (still referred to generally or collectively as phosphor pixels 106). Such an arrangement can enable use of the LED array 200 as a color display.

The individual LEDs (pixels) in an LED array may be individually addressable, may be addressable as part of a group or subset of the pixels in the array, or may not be addressable. Thus, light emitting pixel arrays are useful for any application requiring or benefiting from fine-grained intensity, spatial, and temporal control of light distribution. These applications may include, but are not limited to, precise special patterning of emitted light from pixel blocks or individual pixels, in some instances including the formation of images as a display device. Depending on the application, emitted light may be spectrally distinct, adaptive over time, and/or environmentally responsive. The light emitting pixel arrays may provide preprogrammed light distribution in various intensity, spatial, or temporal patterns. The emitted light may be based at least in part on received sensor data and may be used for optical wireless communications. Associated electronics and optics may be distinct at a pixel, pixel block, or device level.

FIGS. 5A and 5B are examples of LED arrays 200 employed in display applications, wherein an LED display includes a multitude of display pixels. In some examples (e.g., as in FIG. 5A), each display pixel comprises a single semiconductor LED pixel 102 and a corresponding phosphor pixel 106R, 106G, or 106B of a single color (red, green, or blue). Each display pixel only provides one of the three colors. In some examples (e.g., as in FIG. 5B), each display pixel includes multiple semiconductor LED pixels 102 and multiple corresponding phosphor pixels 106 of multiple colors. In the example shown each display pixel includes a 3×3 array of semiconductor pixels 102; three of those LED pixels have red phosphor pixels 106R, three have green phosphor pixels 106G, and three have blue phosphor pixels 106B. Each display pixel can therefore produce any desired color combination. In the example shown the spatial arrangement of the different colored phosphor pixels 106 differs among the display pixels; in some examples (not shown) each display pixel can have the same arrangement of the different colored phosphor pixels 106.

As shown in FIGS. 6A and 6B, a pcLED array 200 may be mounted on an electronics board 300 comprising a power and control module 302, a sensor module 304, and an LED attach region 306. Power and control module 302 may receive power and control signals from external sources and signals from sensor module 304, based on which power and control module 302 controls operation of the LEDs. Sensor module 304 may receive signals from any suitable sensors, for example from temperature or light sensors. Alternatively, pcLED array 200 may be mounted on a separate board (not shown) from the power and control module and the sensor module.

In some instances decreasing pixel size and increasing pixel density can lead to problems. Light emitting by an LED pixel or its associated phosphor is emitted in all directions, in some examples in an angular distribution that approximates a Lambertian distribution. Because of this, with decreasing pixel spacing and separation it can be difficult to prevent light emitted by one LED pixel from overlapping with light emitting by another LED pixel of a pixel array (referred to as crosstalk), thereby decreasing the effective resolution of the LED pixel array or causing unwanted pixel lighting overlap of illuminated areas. This can be especially problematic for designs that have separate LED light emitters in a pixel array but still use a single phosphor layer. The optical isolation barriers 220 formed in the converter material 106 in the example of FIG. 4B are intended to reduce crosstalk between adjacent pixels of an array. Such barriers can take many different forms. In some examples multiple separated phosphor regions can be employed, each associated with a corresponding LED pixel. Separation can be accomplished by use of optically reflective, scattering, or absorptive sidewalls. In many examples wafer-level application and processing of such sidewalls can be difficult and expensive, becoming more so as pixel spacing and/or separation are reduced.

Figure 7:
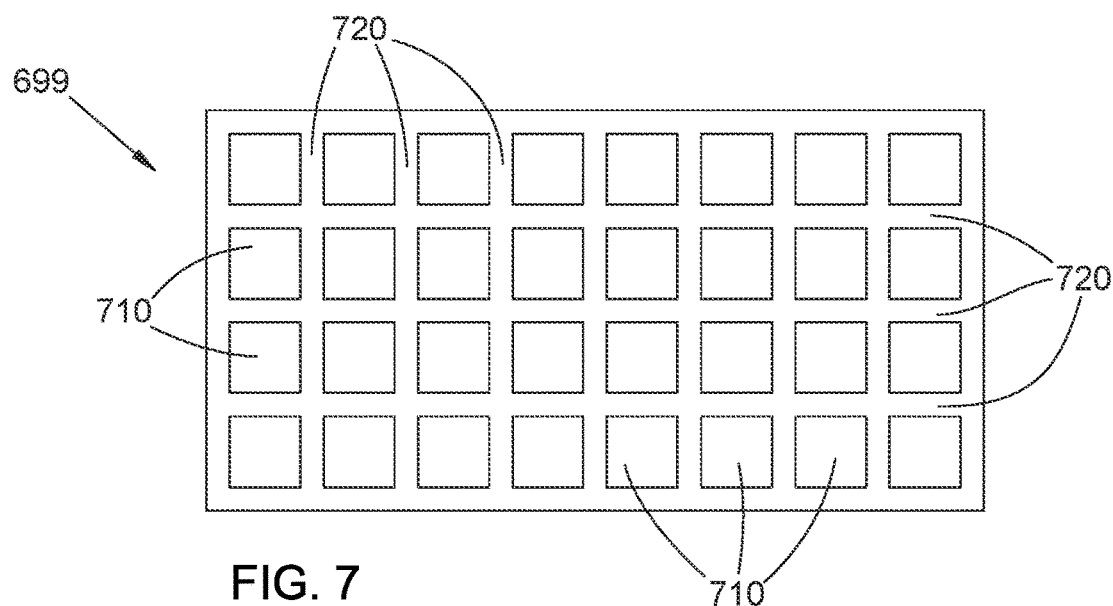
FIG. 7 is a schematic plan view of an inventive wavelength-converting optical element.

An inventive wavelength-converting optical element 699 includes a phosphor material layer 700 having laterally heterogenous optical properties that can be arranged, e.g., to mitigate at least partly the crosstalk problems noted above. Examples are illustrated schematically in FIGS. 7, 8A/8B, and 9A/9B. "Laterally" indicates a direction generally parallel to the opposite surfaces 701 and 702 of the layer 700 and generally perpendicular to emission surfaces of LED pixels of an LED array with which the wavelength-converting optical element 699 is employed. The material layer 700 includes a plurality of discrete pixel regions 710 and intervening border regions 720; the border regions 720 at least partly surround each one of the pixel regions 710 and at least partly separate each pixel region 710 from adjacent pixel regions 710. In some examples, the first and second surfaces 701 and 702 can be substantially flat.

In each pixel region 710 are a corresponding plurality of pixel phosphor particles 712 and a transparent pixel binder. In some examples (e.g., FIGS. 8A and 8B), the pixel binder comprises a transparent pixel coating 714 at least partly coating each pixel phosphor particle 712 and binding them together within the corresponding pixel region 710; the pixel coating 714 leaves voids 716 among the bound pixel phosphor particles 712. In some other examples (e.g., FIGS. 9A and 9B), the pixel binder comprises a transparent solid pixel medium 718 substantially filling the corresponding pixel region 710; the pixel phosphor particles 712 are embedded within the solid pixel medium 718.

In some examples the pixel phosphor particles 712 and the border phosphor particles 722 can have the same material composition. In some other examples the pixel phosphor particles 712 can have a material composition different from that of the border phosphor particles 722; in some such examples, pixel phosphor particles 712 and the border phosphor particles 722 can nevertheless exhibit similar optical emission spectra. In some examples the pixel phosphor particles 712 and the border phosphor particles 722 can have the same refractive index. In some other examples the pixel phosphor particles 712 can have a refractive index different from that of the border phosphor particles 722.

In the border regions 720 are a plurality of border phosphor particles 722 and a transparent border binder. In some examples (e.g., as in FIGS. 8A and 8B), the border binder comprises a transparent border coating 724 at least partly coating each border phosphor particle 722 and binding them together; the border coating 724 leaves voids 726 among the bound border phosphor particles 722. In some other examples (e.g., FIGS. 9A and 9B), the border binder comprises a transparent solid border medium 728 substantially filling the border regions 720; the border phosphor particles 722 are embedded within the solid border medium 728.

The pixel regions 710 differ from the border regions 720 with respect to one or more of: (i) differing sizes, compositions, or refractive indices characterizing the pixel phosphor particles 712 and the border phosphor particles 722, (ii) differing thicknesses, compositions, or refractive indices characterizing the pixel coating 714 and the border coating 724, (iii) differing size, number density, or volume fraction characterizing voids 716/726 among the pixel phosphor particles 712 and among the border phosphor particles 722, or (iv) differing compositions or refractive indices characterizing the solid pixel medium 718 and the solid border medium 728. Those one or more differences can cause the border regions 720 to exhibit optical scattering (of light emitted by the pixel or border phosphor particles 712/722) that is greater than that optical scattering exhibited by the pixel regions 710.

In some examples (e.g., FIG. 8A or 9A), each pixel region 710 and border region 720 extends entirely through the layer 700 from its first surface 701 to its second surface 702. In that arrangement, each pixel region 710 is entirely separated from adjacent pixel regions 710 by intervening border regions 720. In other examples (e.g., as in FIG. 8B or 9B), each pixel region 710 extends entirely through the layer 700 from its first surface 701 to its second surface 702, but each border region 720 extends only partly from the first surface 701 toward the second surface 702. In that arrangement, each pixel region 710 is separated from adjacent pixel regions 710 at the first surface 701, but is contiguous with one or more adjacent pixel regions 710 at the second surface 702.

In some examples the optical element 699 can include a substrate 698 positioned against the first surface 701 of the material layer 700. In some examples such a substrate 698 can include one or more transparent dielectric layers 697, or one or more semiconductor LED layers or structures 696, or both (typically with the dielectric layers 697 between the optical element 699 and the semiconductor LED layers 696. In some instances the layer 700 can be formed directly on the substrate 698; in other examples an already-formed layer 700 can be attached to the substrate 698.

Figure 8A:
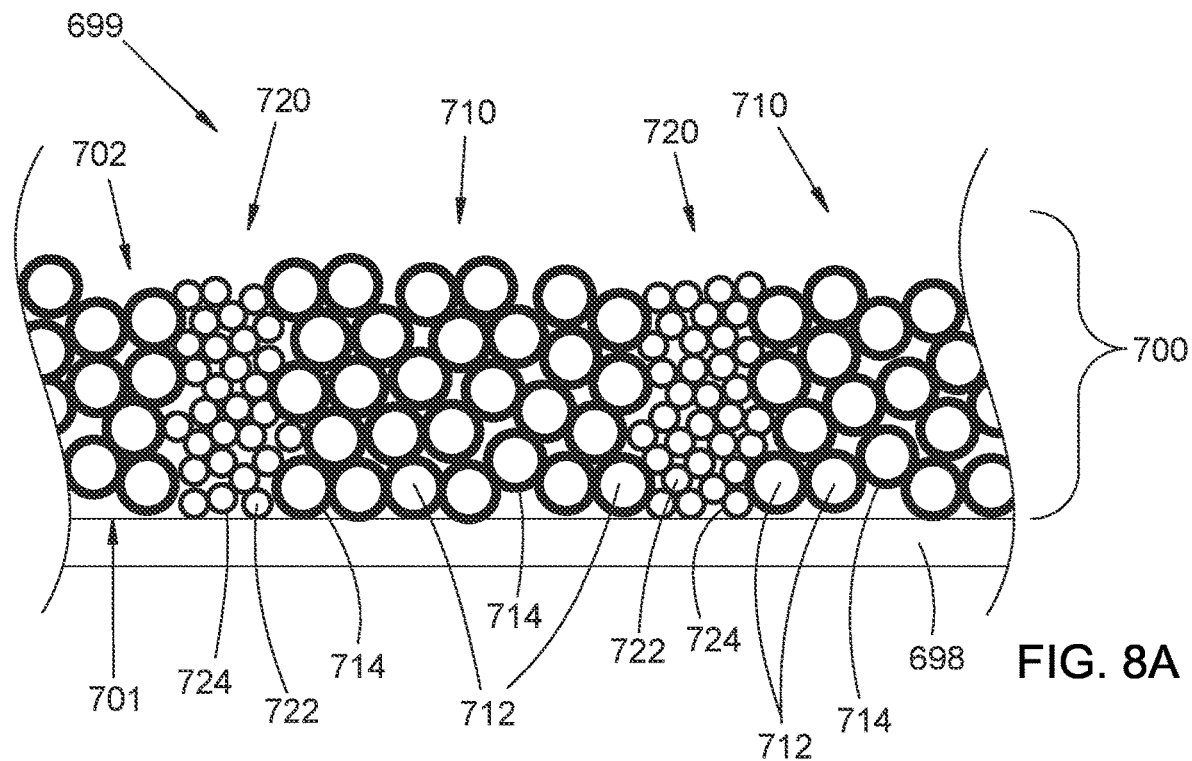
FIGS. 8A and 8B are schematic side cross-sectional views of examples of an inventive wavelength-converting optical element.
Figure 8B:
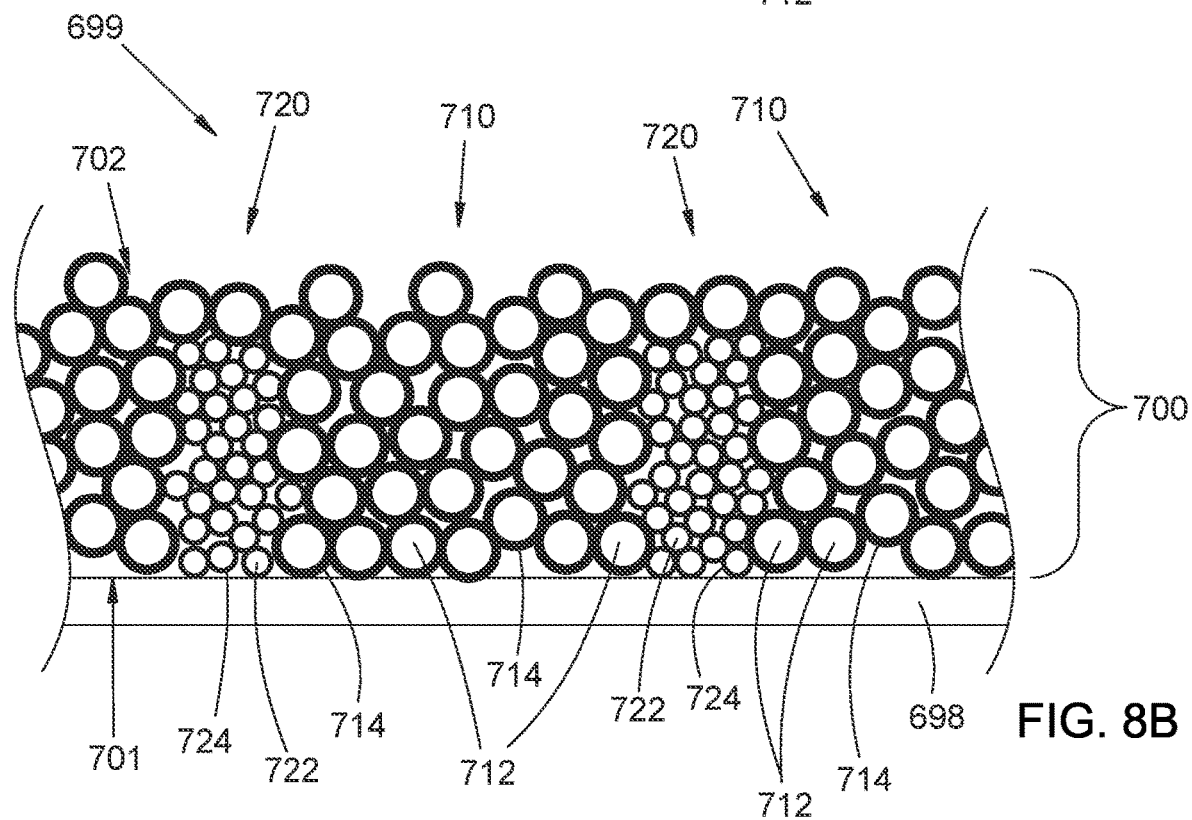

In the examples arranged as in FIG. 8A or 8B, the pixel binder is the pixel coating 714 and the border binder is the border coating 724. In some of those examples the border phosphor particles 722 can be smaller than the pixel phosphor particles 712. In some examples the border phosphor particles 722 can have a characteristic size that is less than 30%, less than 50%, less than 67%, or less than 75% of a characteristic size of the pixel phosphor particles. In some examples the pixel phosphor particles 712 can have a non-zero characteristic size less than 20 μm, less than 10 μm, or less than 5 μm; in some examples the border phosphor particles 722 can have a non-zero characteristic size less than 10 μm, less than 5 μm, or less than 2.5 μm. In some examples the border phosphor particles 722 can have a non-zero characteristic size that is less than 50% of separation between adjacent pixel regions 710. "Characteristic size" can be defined in any suitable way, including D50 (i.e., the median particle diameter), mean particle diameter, maximum particle diameter, particle diameter range (defined in any suitable way), and so forth.

In examples arranged as in FIG. 8A or 8B, any one or more differences between the pixel phosphor particles 712 and the border phosphor particles 722, e.g., characteristic particle size, material composition, or refractive index, can result in increased optical scattering by the border regions 720 relative to the pixel regions 710, which can in turn decrease optical crosstalk between adjacent pixels regions 710.

In some examples arranged as in FIG. 8A or 8B, the border coating 724 can be thinner than the pixel coating 714. In some examples, the border coating 724 can have a characteristic thickness that is less than 30%, less than 50%, less than 67%, or less than 75% of a characteristic thickness of the pixel coating 724. "Characteristic thickness" can be defined in any suitable way, including mean thickness, median thickness, minimum or maximum thickness, thickness range (defined in any suitable way), and so forth. In examples wherein the coating thickness differs between the pixel coating 714 and the border coating 724, the characteristic sizes of the phosphor particles 712 and the border phosphor particles 722 can also differ, or they can be about the same. In examples wherein the characteristic sizes of the phosphor particles 712 and the border phosphor particles 722 differ from one another, the coating thickness can also differ between the pixel coating 714 and the border coating 724, or they can be about the same.

In some examples the pixel coating 714 can have a thickness greater than 0.10 µm, greater than 0.20 µm, or greater than 0.30 µm. In some examples the border coating 724 can have a non-zero thickness less than 0.15 µm, less than 0.10 µm, or less than 0.05 µm.

In some examples arranged as in FIG. 8A or 8B, the pixel regions 710 and the border regions 720 can differ with respect to the size or number density of voids 716/726 (typically, but not necessarily, air- or gas-filled) left among the bound phosphor particles 712/722 of each region. In some examples the number density of voids 716 among the pixel phosphor particles 712 can be less than 30%, less than 50%, less than 67%, or less than 75% of the number density of voids 726 among the border phosphor particles 722. In some examples the volume fraction of voids 716 among the pixel phosphor particles 712 can be less than 30%, less than 50%, less than 67%, or less than 75% of the volume fraction of voids 726 among the border phosphor particles 722. In some examples the characteristic size of voids 716 among the pixel phosphor particles 712 can be less than 30%, less than 50%, less than 67%, or less than 75% of a characteristic size of voids 726 among the border phosphor particles 722. Those differing number densities, sizes, or volume fractions between the voids 716 and 726 can accompany differing sizes between the phosphor particles 712 and 722, differing thicknesses between the coatings 714 and 724, or both.

In some examples arranged as in FIG. 8A or 8B, the pixel coating 714 and the border coating 724 can have the same material composition; in some of those examples the pixel coating 714 and the border coating 724 can comprise the same, single coating material. In some other examples the pixel coating 714 can have a material composition different from that of the border coating 724; in some of those examples the pixel coating 712 can include one or more materials absent from the border coating 724. In some examples the pixel coating 714 and the border coating 724 can have the same refractive index; in other examples the pixel coating 714 can have a refractive index different from that of the border coating 724. In some examples the pixel coating 714 can include an inner coating and an outer coating having different corresponding material compositions or refractive indices.

In some examples the pixel coating 714 or the border coating 724 or both can include one or more metal or semiconductor oxides, including but not limited to any one or more materials among $Al_2O_3$, $HfO_2$, $SiO_2$, $Ga_2O_3$, $GeO_2$, $SnO_2$, $CrO_2$, $TiO_2$, $Ta_2O_5$, $Nb_2O_5$, $V_2O_5$, $Y_2O_3$, or $ZrO_2$. In some examples the pixel coating or the border coating or both can include one or more materials compatible with formation using an atomic layer deposition (ALD) process or using a conformal chemical vapor deposition (CVD) process.

In examples arranged as in FIG. 8A or 8B, any one or more differences between the pixel coating 714 and the border coating 724, e.g., characteristic thickness, material composition, or refractive index, can result in increased optical scattering by the border regions 720 relative to the pixel regions 710, which can in turn decrease optical crosstalk between adjacent pixels regions 710. Similarly, any one or more differences between the voids 716 in the pixel regions 710 and the voids 726 in the border regions 720, e.g., characteristic size, number density, or volume fraction, can result in increased optical scattering by the border regions 720 relative to the pixel regions 710, which can in turn decrease optical crosstalk between adjacent pixels regions 710.

Figure 9A:
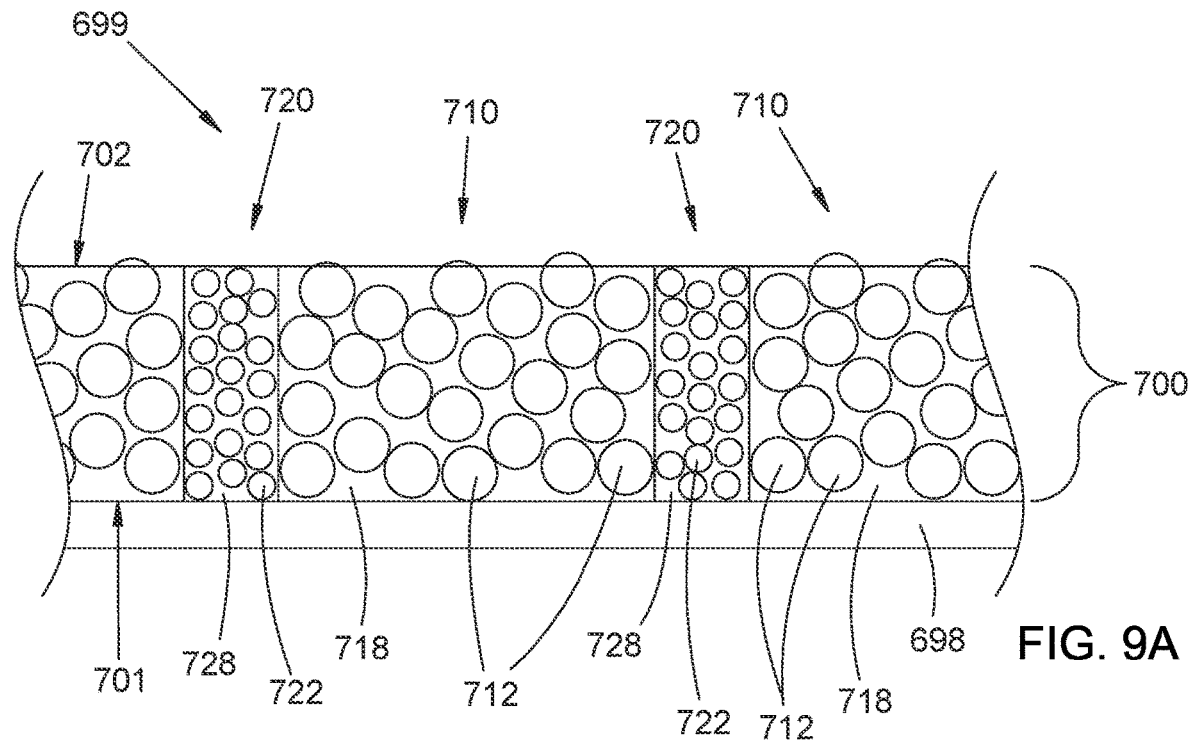
FIGS. 9A and 9B are schematic side cross-sectional views of examples of an inventive wavelength-converting optical element.
Figure 9B:
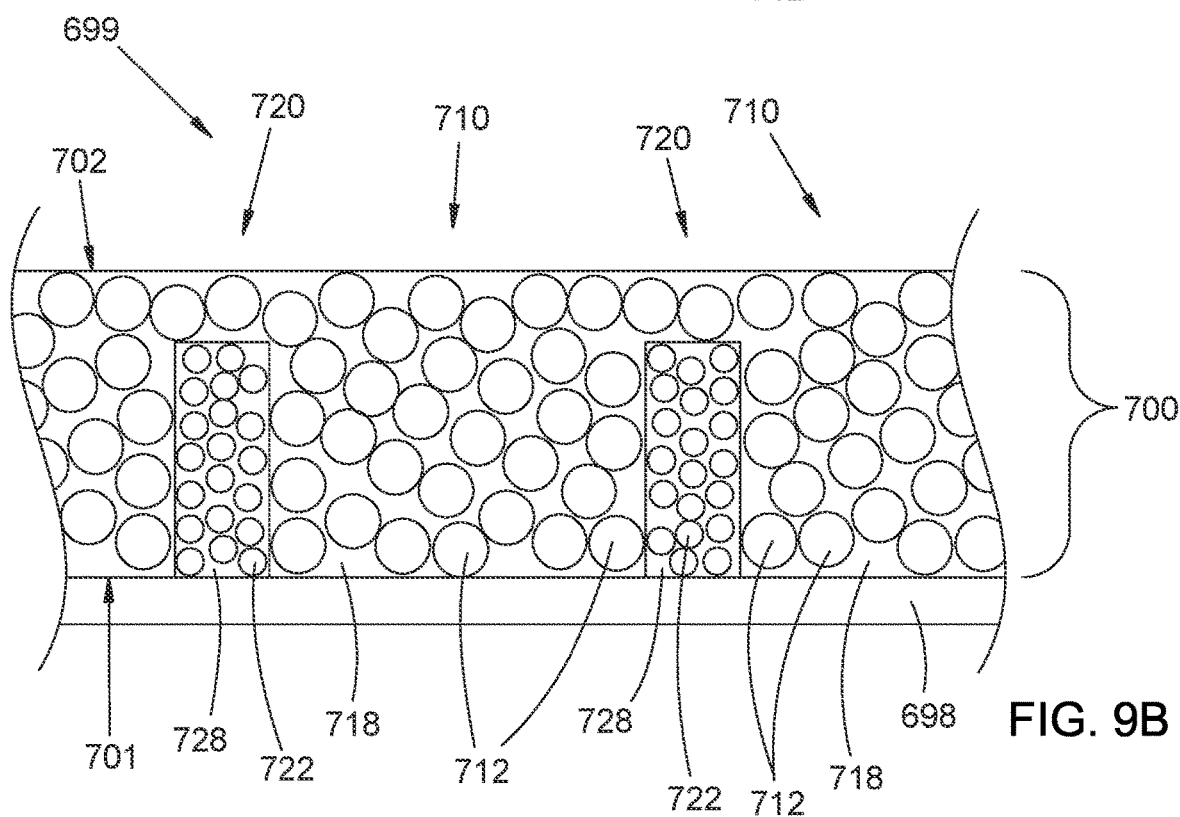

In the examples arranged as in FIG. 9A or 9B, the pixel binder is the pixel medium 718 and the border binder is the border medium 728. The pixel phosphor particles 712 are embedded in the pixel medium 718, and the border phosphor particles 722 are embedded in the border medium 728. In examples arranged as in FIGS. 8A and 8B, the border phosphor 722 particles can have a characteristic size that is less than 30%, less than 50%, less than 67%, or less than 75% of a characteristic size of the pixel phosphor particles 712. In some examples the pixel phosphor particles 712 can have a non-zero characteristic size less than 20 µm, less than 10 µm, or less than 5 µm. In some examples the border phosphor particles 722 can have a non-zero characteristic size less than 10 µm, less than 5 µm, or less than 2.5 µm. In some examples the border phosphor particles 722 can have a non-zero characteristic size that is less than 50% of separation between adjacent pixel regions 710.

In some examples arranged as in FIG. 9A or 9B the border regions 720 can also include scattering particles embedded in the border medium 728, e.g., including $TiO_2$ or other metal oxide or semiconductor oxide particles.

In some examples arranged as in FIG. 9A or 9B, the pixel medium 718 can include one or more polymers, e.g., one or more silicones. In some examples, the border medium 728 can include one or more polymers, e.g., one or more silicones. In some examples the pixel medium 718 and the border medium 728 can have the same material composition; in other examples the pixel medium 718 can have a material composition different from that of the border medium 728. In some examples the pixel medium 718 and the border medium 728 can have the same refractive index; in other examples the pixel medium 718 can have a refractive index different from that of the border medium 728.

In examples arranged as in FIG. 9A or 9B, any one or more differences between the pixel phosphor particles 712 and the border phosphor particles 722, e.g., characteristic particle size, material composition, or refractive index, can result in increased optical scattering by the border regions 720 relative to the pixel regions 710, which can in turn decrease optical crosstalk between adjacent pixels regions 710. Similarly, any one or more differences between the pixel medium 718 and the border medium 728, e.g., material composition or refractive index, can result in increased optical scattering by the border regions 720 relative to the pixel regions 710, which can in turn decrease optical crosstalk between adjacent pixels regions 710.

Figure 12:
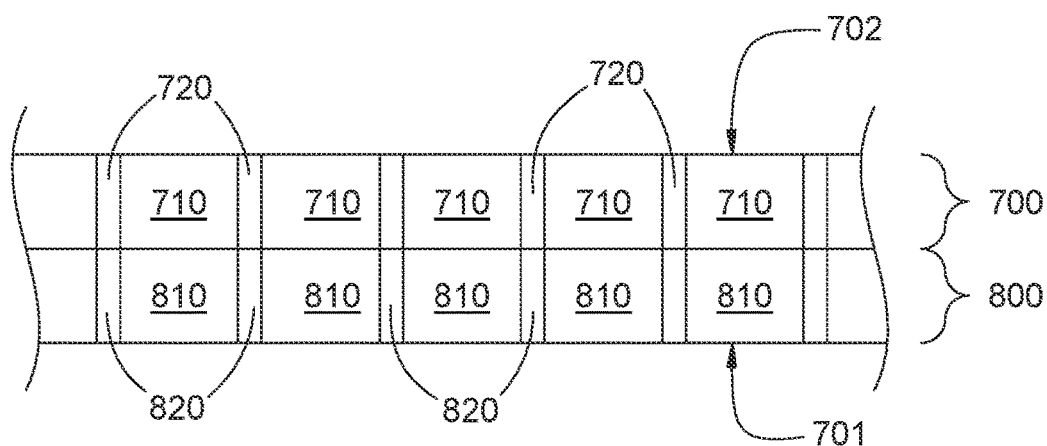
FIG. 12 is a schematic side cross-sectional view of an example inventive wavelength-converting optical element positioned on an array of light-emitting pixels.

An inventive wavelength-converting optical element can be combined with an array 800 of semiconductor light-emitting pixels 810 (e.g., light-emitting diodes (LEDs) 810) that emit light at a first wavelength. An example is illustrated schematically in FIG. 12. The array 800 can be of any suitable type or arrangement, including any of those described above, and can include any suitable or desirable number or arrangement of light-emitting pixels 800. The pixels of the array can be monolithically formed on a single semiconductor wafer, or can be singulated devices that are assembled onto an array substrate. The pixel array 800 is positioned so that light emitted by the light-emitting pixels 810 enters the first surface 701 of the layer 700 of the wavelength-converting optical element 699, where it is at least partly absorbed by the pixel phosphor particles 712 and the border phosphor particles 722. The phosphor particles 712 and 722 in turn emit down-converted light at one or more down-converted wavelengths longer than the first wavelength. Spacing of the light-emitting pixels 810 substantially matches spacing of the pixel regions 710 of the wavelength-converting optical element 699, and the wavelength-converting optical element 699 is positioned so that its pixel regions 710 are substantially aligned with the light-emitting pixels 810 of the array 800; in some instances some degree of misalignment can be tolerated. In some examples each light-emitting pixel 810 of the array 800 can be operable independently of at least one other light-emitting pixel 810 of the array 800. In some examples each pixel 810 can be operable independently of all other pixels 810 of the array 800.

In some examples the array 800 can be a miniLED array or a microLED array. In some examples spacing of the light-emitting pixels 810 of the array 800 can be less than about 1.0 mm, less than about 0.50 mm, less than about 0.33 mm, less than about 0.20 mm, less than about 0.10 mm, less than about 0.08 mm, less than about 0.05 mm, less than about 0.033 mm, or less than about 0.020 mm. Accordingly, spacing of the pixel regions 710 of the optical element 699 also can be less than about 1.0 mm, less than about 0.50 mm, less than about 0.33 mm, less than about 0.20 mm, less than about 0.10 mm, less than about 0.08 mm, less than about 0.05 mm, less than about 0.033 mm, or less than about 0.020 mm.

In many examples the light-emitting pixels 810 are separated by dark (i.e., non-light-emitting) pixel borders 820 between them (e.g., trenches, lanes, or streets; in some instances filled with one or more solid materials). The pixel borders 820 delineate and separate the pixels 810 of the array. In some examples the border regions 720 of the optical element can be aligned with the pixel border 820. In some examples the non-light-emitting pixel borders 820 can have a non-zero width less than 0.10 mm, less than 0.050 mm, less than 0.033 mm less than 0.020 mm, less than 0.010 mm, or less than 0.005 mm. In some examples the border regions 720 can have corresponding widths equal to widths of the corresponding pixel borders 820. In some examples the border regions 720 can have corresponding widths larger than widths of the corresponding pixel borders 820. In some examples width of the border regions 720 can be less than 0.10 mm, less than 0.050 mm, less than 0.033 mm, less than 0.020 mm, less than 0.010 mm, less than 0.008 mm, or less than 0.005 mm.

The border regions 720 of the optical element 699 can reduce crosstalk, with respect to emitted down-converted light, between adjacent pixels 810 of the array 800. The reduced crosstalk can result from increased optical scattering by the border regions 720 (described above) relative to the pixel regions 710. In some examples the pixel regions 720 can exhibit a contrast ratio for down-converted light, exiting the second surface 702 of the layer 700 from adjacent pixel regions 720, that is greater than 5:1, greater than 10:1, greater than 20:1, greater than 50:1, greater than 100:1, or greater than 300:1. Lower contrast ratios (e.g., 5:1 or 10:1) might represent an acceptable improvement in arrays with relatively small spacing (e.g., less than 100 μm or less than 50 μm); larger contrast ratios might be expected in arrays having larger spacings.

Figure 13:
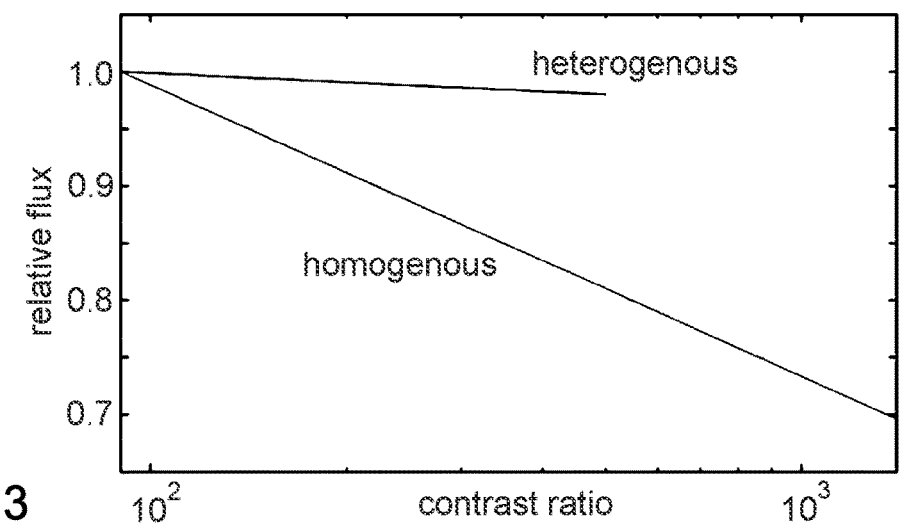
FIG. 13 is a plot of simulated data of luminance versus contrast ratio for a laterally heterogenous wavelength-converting optical element and a laterally homogenous wavelength-converting layer.

In some examples, an array of light-emitting pixels 800 used in conjunction with an inventive wavelength-converting optical element 699 can exhibit overall luminance that varies little with observed contrast ratio. This is in contrast to devices with a laterally homogenous wavelength-converting layer, which can exhibit decreasing luminance with increasing contrast ratio. Simulated data is plotted in FIG. 13 for layers that are identical except for the presence of the border regions 720.

In some examples the first surface 701 of the layer 700 of the optical element 699 can be positioned against a light-emitting surface of the light-emitting pixel array 800. In other examples one or more transparent dielectric layers can be positioned between the optical element 699 and a light-emitting surface of the light-emitting pixel array 800. In such examples the first surface 701 of the material layer 700 of the optical element 699 can be positioned against the dielectric substrate layer.

In some examples the array 800 can comprising an array of semiconductor light-emitting diodes, i.e., LED pixels 810. In some examples the LED pixels 810 can include one or more doped or undoped III-V, II-VI, or Group IV semiconductor materials or alloys or mixtures thereof. In some examples each LED pixel can include one or more p-n junctions, one or more quantum wells, one or more multi-quantum wells, or one or more quantum dots. In some examples the light emitted by the semiconductor light-emitting pixels can have a vacuum wavelength greater than 0.20 μm, greater than 0.4 μm, greater than 0.8 μm, less than 10 μm, less than 2.5 μm, or less than 1.0 μm.

Generally, a method for making a light-emitting device that includes an inventive optical element 699 and a light-emitting array 800 comprises positioning the optical element 699 with the first surface 701 of the material layer 700 thereof facing light-emitting surfaces of the light-emitting pixels 810 of the array 800, and with the pixel regions 710 substantially aligned with the light-emitting pixels 810. In some examples the optical element 699 can be positioned directly against the light-emitting surfaces of the array 800; in other examples one or more transparent dielectric layers can be positioned between the optical element 699 and the array 800.

The material layer 700 can be fabricated in any suitable way. Generally such a method comprises (i) binding together with the pixel binder a corresponding plurality of pixel phosphor particles 712 in each of the pixel regions 720; and (ii) binding together with the border binder the plurality of border phosphor particles 722 in the border regions 720. The phosphor particles of the pixel regions 710 and the boundary regions 720 are also bound together to form the material layer 700.

Figure 10A:
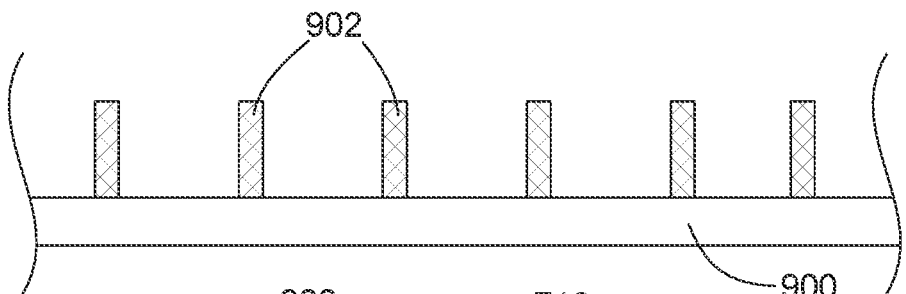
FIGS. 10A-10F illustrate schematically an example method for making an inventive wavelength-converting optical element.
Figure 10B:
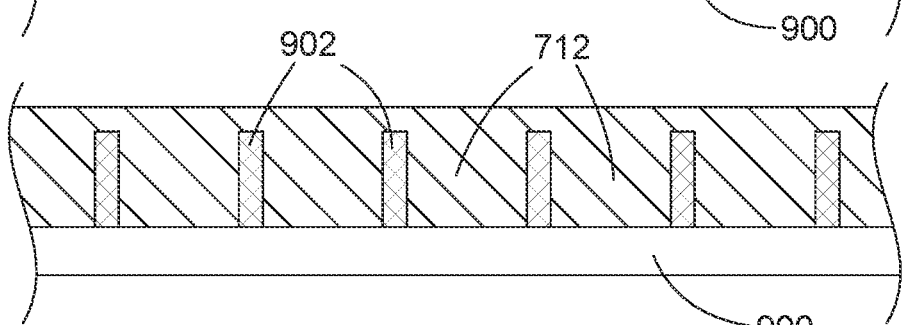
Figure 10C:
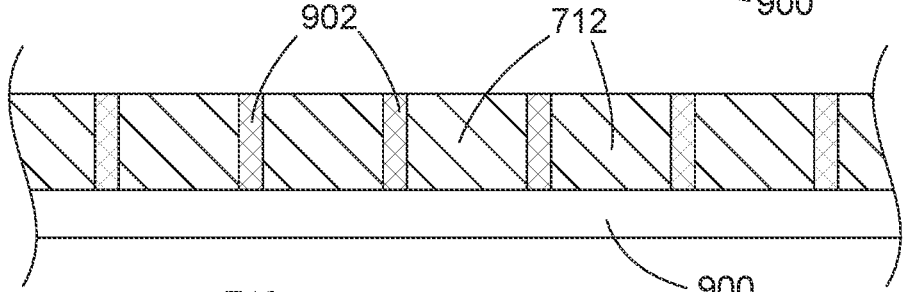
Figure 10D:
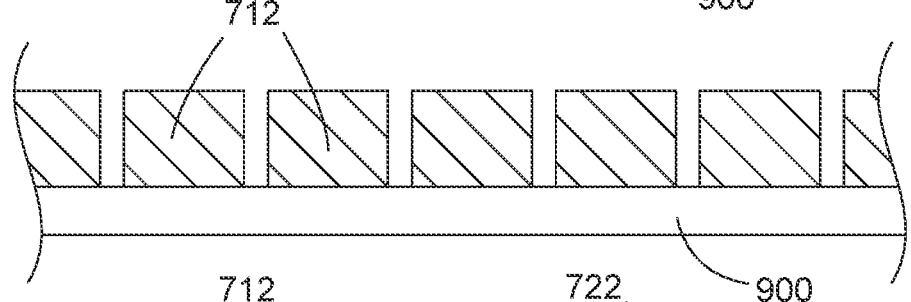
Figure 10E:
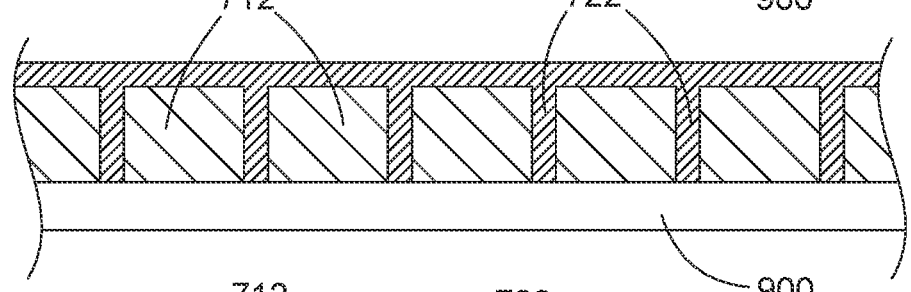
Figure 10F:
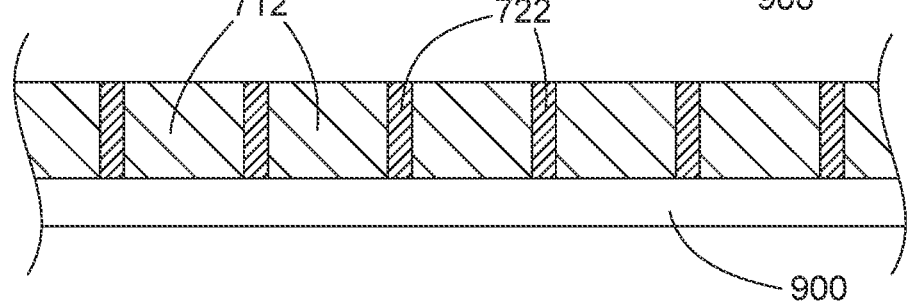
Figure 11A:
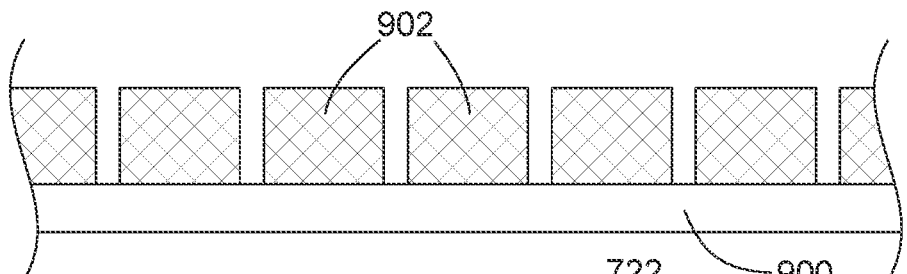
FIGS. 11A-11F illustrate schematically an example method for making an inventive wavelength-converting optical element.
Figure 11B:
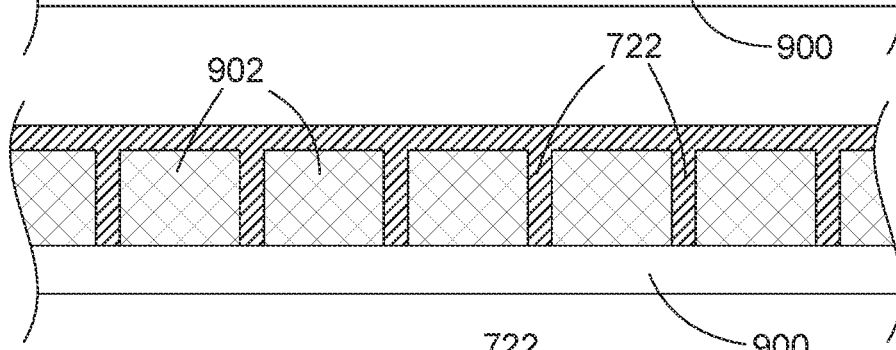
Figure 11C:
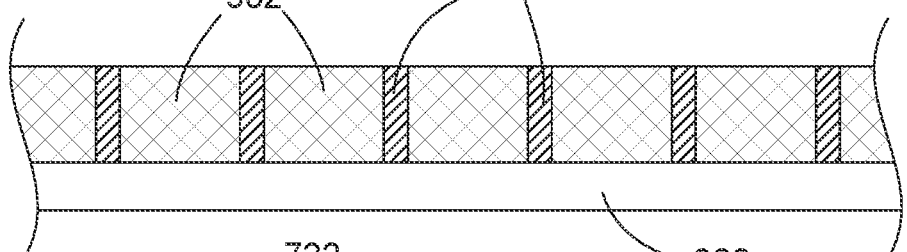
Figure 11D:
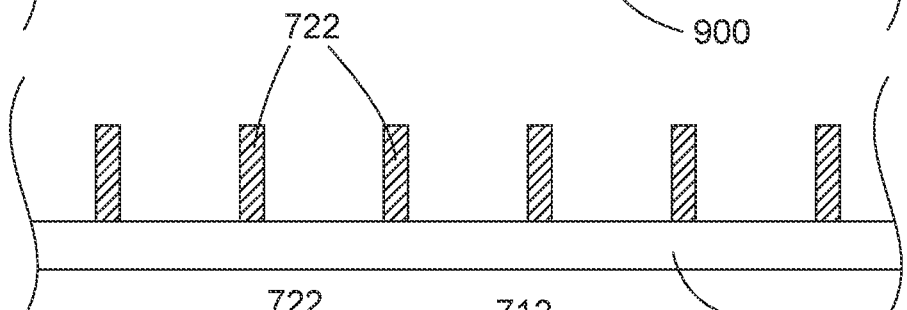

In some examples (e.g., as in the example sequences of FIGS. 10A-10F or 11A-11F), the fabrication method can begin with masking selected areas of a substrate 900 (by spatially selective formation or deposition of mask material 902 on those selected areas, while leaving the remaining areas of the substrate 900 unmasked (resulting in the arrangements of FIG. 10A or 11A). Any suitable spatially selective technique can be employed; in some examples photolithography can be employed, using a negative or positive photoresist as needed or desired. Pluralities of first phosphor particles (either pixel phosphor particles 712 as shown in FIGS. 10B and 10C, or border phosphor particles 722 as shown in FIGS. 11B and 11C) can be deposited onto the unmasked areas of the substrate in any suitable way (e.g., sedimentation, blade-coating, electrophoretic deposition, and so forth). In some instances, no first phosphor particles are deposited on top of the mask material 902 (as in FIG. 10C or 11C); in some other instances the first phosphor particles might also be deposited on top of the mask material 902 in the masked regions (as in FIG. 10B or 11B). In either case, the deposited first phosphor particles are then bound together with a first binder (either the pixel binder in FIG. 10B or 10C, or the border binder as shown in FIG. 11B or 11C).

If first phosphor particles were deposited on top of the mask material 902 (as in FIG. 10B or 11B), those deposited phosphor particles can be removed using any suitable planarization process, e.g., grinding, lapping, or chemical mechanical polishing (CMP), resulting in the arrangements of FIG. 10C or 11C, respectively. Once in one of those arrangements, the mask material 902 is then removed by any suitable process, resulting in the arrangements of FIG. 10D or 11D, respectively.

Figure 11E:
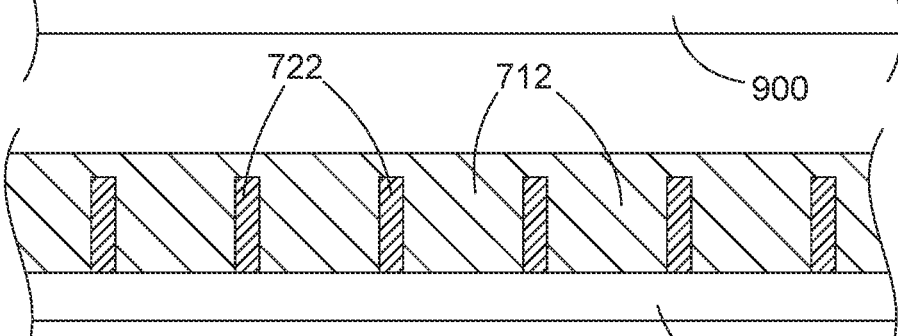
Figure 11F:
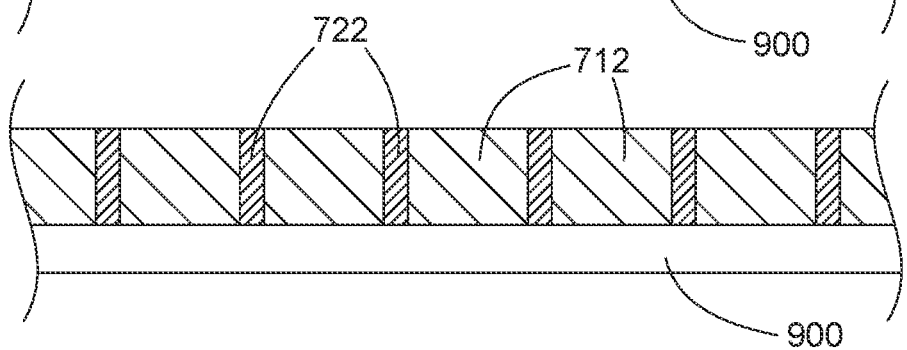

Next, pluralities of second phosphor particles (either border phosphor particles 722 as shown in FIGS. 10E and 10F, or pixel phosphor particles 712 as shown in FIGS. 11E and 11F) are deposited onto the substrate 900 between the deposited, bound pluralities of first phosphor particles. The second phosphor particles can be deposited in any suitable way (e.g., sedimentation, blade-coating, electrophoretic deposition, and so forth). In some instances, no second phosphor particles are deposited on top of the bound first phosphor particles (as in FIG. 10F or 11F); in some other instances the second phosphor particles might also be deposited on top of the bound first phosphor particles (as in FIG. 10E or 11E). In either case, the deposited second phosphor particles are then bound together with a second binder (either the border binder in FIG. 10E or 10F, or the pixel binder as shown in FIG. 11E or 11F). The second binder also binds together the regions of bound first and second phosphor particles to form the material layer 700.

If no second phosphor particles were deposited onto the bound first phosphor particles, the arrangements of FIG. 10F or 11F are obtained. If some second phosphor particles were deposited on top of the bound first phosphor particles (as in FIG. 10E or 11E), if desired those deposited second phosphor particles can be removed using any suitable planarization process, e.g., grinding, lapping, or chemical mechanical polishing (CMP), resulting in the arrangements of FIG. 10F or 11F, respectively. However, in some instances it can be desirable to leave the second phosphor particle covering the first phosphor particles, resulting in the arrangements of FIG. 10E or 11E, respectively.

In the fabrication sequence illustrated schematically in FIGS. 10A-10F, the masked areas of the substrate 900 correspond to the border regions 720, the first phosphor particles deposited are the pixel phosphor particles 712, and first binder is either the pixel coating 714 (leading to arrangements such as that in FIG. 8A) or the pixel medium 718 (leading to arrangements such as that in FIG. 9A). After removal of the mask material 902, the second phosphor particles deposited are the border phosphor particles 722, and the second binder is either the border coating 724 (resulting in arrangements such as that in FIG. 8A) or the border medium 728 (resulting in arrangements such as that in FIG. 9A). If any border phosphor particles 722 are bound on top of the pixel phosphor particles 712, they can be removed by planarization to result in the arrangements of FIG. 8A or 9A.

In the fabrication sequence illustrated schematically in FIGS. 11A-11F, the masked areas of the substrate 900 correspond to the pixel regions 710, the first phosphor particles deposited are the border phosphor particles 722, and first binder is either the border coating 724 (leading to arrangements such as those in FIG. 8A or 8B) or the border medium 728 (leading to arrangements such as those in FIG. 9A or 9B). After removal of the mask material 902, the second phosphor particles deposited are the pixel phosphor particles 712, and the second binder is either the pixel coating 714 (resulting in arrangements such as those in FIG. 8A or 8B) or the pixel medium 718 (resulting in arrangements such as those in FIG. 9A or 9B). If any pixel phosphor particles 712 are bound on top of the border phosphor particles 722, they can be removed by planarization to result in the arrangements of FIG. 8A or 9A, they can be left in place to result in the arrangements of FIG. 8B or 9B.

In some examples the first phosphor particles can be bound together using one or more atomic layer deposition (ALD) processes or one or more chemical vapor deposition (CVD) processes to form the first binder as a first coating on the first phosphor particles (e.g., the pixel coating 714 binding together the pixel phosphor particles 712 in the sequence of FIGS. 10A-10F, leading to the arrangements of FIG. 8A or 8B; or the border coating 724 binding together the border phosphor particles 722 in the sequence of FIGS. 11A-11F, leading to the arrangements of FIG. 8A or 8B). In some examples the mask material and/or the first coating can be chosen so that the coating medium can be formed with reagents or under conditions that do not cause excessive degradation or deformation of the mask material 902. In some examples, before forming the mask, a protection layer can be formed on the substrate 900 that is less reactive to ALD or CVD reagents than the substrate 900.

In some examples the second phosphor particles can be bound together using one or more ALD processes or one or more CVD processes to form the second binder as a second coating on the second phosphor particles (e.g., the border coating 724 binding together the border phosphor particles 722 in the sequence of FIGS. 10A-10F, resulting in the arrangements of FIG. 8A or 8B; or the pixel coating 714 binding together the pixel phosphor particles 712 in the sequence of FIGS. 11A-11F, resulting in the arrangements of FIG. 8A or 8B). In some examples the second coating can be formed on the bound first phosphor particles over the first coating, resulting in a larger thickness of coating material on the first phosphor particles. In the process of FIGS. 10A-10F, for example, using ALD or CVD processes for forming both the pixel coating 714 and the border coating 724 results in a thicker overall coating 714 on the pixel phosphor particles 712 and smaller and less numerous voids 716 (resulting from both first and second binding deposition processes) compared to the coating 724 on the border phosphor particles 722 and the voids 726 (resulting from only the second binding deposition process).

In some examples the first phosphor particles can be bound together using deposition of one or more precursors (e.g., monomers, initiators, cross-linkers, or other polymer precursors) and curing the one or more precursors to form the first binder as a first transparent solid medium embedding the first phosphor particles (e.g., the pixel medium 718 binding together the pixel phosphor particles 712 in the sequence of FIGS. 10A-10F, leading to the arrangements of FIG. 9A or 9B; or the border medium 728 binding together the border phosphor particles 722 in the sequence of FIGS. 11A-11F, leading to the arrangements of FIG. 9A or 9B). In some examples the mask material and/or the first solid transparent medium can be chosen so that the solid medium can be cured at temperatures or under other conditions that do not cause excessive degradation or deformation of the mask material 902. In some examples the second phosphor particles can be bound together using deposition of one or more precursors (e.g., monomers, initiators, cross-linkers, or other polymer precursors) and curing the one or more precursors to form the second binder as a second transparent solid medium embedding the second phosphor particles (e.g., the border medium 728 binding together the border phosphor particles 722 in the sequence of FIGS. 10A-10F, resulting in the arrangements of FIG. 9A or 9B; or the pixel medium 718 binding together the pixel phosphor particles 712 in the sequence of FIGS. 11A-11F, resulting in the arrangements of FIG. 9A or 9B).

In some examples the material layer formed as described above can be removed from the substrate 900 and transferred to the substrate 698, which can include one or more dielectric layers 697, one or more semiconductor LED layers 696, or both. In some other examples, the material layer 700 can be formed on the light-emitting pixel array 800, which acts as the substrate 900. In such examples the material layer can be formed directly on light-emitting surfaces of the array 800, or one or more intervening transparent dielectric layers.

In addition to the preceding, the following example embodiments fall within the scope of the present disclosure or appended claims:

Example 1. A wavelength-converting optical element comprising: (a) a solid material layer having opposite first and second surfaces and comprising a plurality of discrete pixel regions and intervening border regions that at least partly surround each one of the pixel regions and at least partly separate each pixel region from adjacent pixel regions; (b) for each pixel region, a corresponding plurality of pixel phosphor particles and a transparent pixel binder, the pixel binder comprising either (i) a transparent pixel coating at least partly coating each pixel phosphor particle and binding together the pixel phosphor particles of the corresponding pixel region while leaving voids among the bound pixel phosphor particles, or (ii) a transparent solid pixel medium substantially filling the corresponding pixel region in which the pixel phosphor particles are embedded; and (c) in the border regions, a plurality of border phosphor particles and a transparent border binder, the border binder comprising either (i) a transparent border coating at least partly coating each border phosphor particle and binding together the border phosphor particles while leaving voids among the bound border phosphor particles, or (ii) a transparent solid border medium substantially filling the border regions in which the border phosphor particles are embedded, (d) the pixel regions differing from the border regions with respect to one or more of: (i) differing sizes, compositions, or refractive indices characterizing the pixel phosphor particles and the border phosphor particles, (ii) differing thicknesses, compositions, or refractive indices characterizing the pixel coating and the border coating, (iii) differing size, number density, or volume fraction characterizing voids among the pixel phosphor particles and among the border phosphor particles, or (iv) differing compositions or refractive indices characterizing the solid pixel medium and the solid border medium.

Example 2. The optical element of Example 1, the border regions exhibiting optical scattering of light emitted by the pixel or border phosphor particles that is greater than that optical scattering exhibited by the pixel regions.

Example 3. The optical element of any one of Examples 1 or 2, further comprising a substrate positioned against the first surface of the solid material layer.

Example 4. The optical element of Example 3, the substrate including one or more transparent dielectric layers.

Example 5. The optical element of any one of Examples 3 or 4, the substrate including one or more semiconductor LED structures.

Example 6. The optical element of any one of Examples 1 through 5, the border phosphor particles having a characteristic size that is less than 30%, less than 50%, less than 67%, or less than 75% of a characteristic size of the pixel phosphor particles.

Example 7. The optical element of any one of Examples 1 through 6, the pixel phosphor particles having a non-zero characteristic size less than 20 μm, less than 10 μm, or less than 5 μm.

Example 8. The optical element of any one of Examples 1 through 7, the border phosphor particles having a non-zero characteristic size less than 10 μm, less than 5 μm, or less than 2.5 μm.

Example 9. The optical element of any one of Examples 1 through 8, the border phosphor particles having a non-zero characteristic size that is less than 50% of separation between adjacent pixel regions.

Example 10. The optical element of any one of Examples 1 through 9, the pixel phosphor particles having a material composition different from that of the border phosphor particles.

Example 11. The optical element of any one of Examples 1 through 9, the pixel phosphor particles and the border phosphor particles having the same material composition.

Example 12. The optical element of any one of Examples 1 through 11, the pixel phosphor particles having a refractive index different from that of the border phosphor particles.

Example 13. The optical element of any one of Examples 1 through 11, the pixel phosphor particles and the border phosphor particles having the same refractive index.

Example 14. The optical element of any one of Examples 1 through 13, the border coating having a characteristic thickness that is less than 30%, less than 50%, less than 67%, or less than 75% of a characteristic thickness of the pixel coating.

Example 15. The optical element of any one of Examples 1 through 14, number density of voids among the pixel phosphor particles being less than 30%, less than 50%, less than 67%, or less than 75% of number density of voids among the border phosphor particles.

Example 16. The optical element of any one of Examples 1 through 15, volume fraction of voids among the pixel phosphor particles being less than 30%, less than 50%, less than 67%, or less than 75% of volume fraction of voids among the border phosphor particles.

Example 17. The optical element of any one of Examples 1 through 16, a characteristic size of voids among the pixel phosphor particles being less than 30%, less than 50%, less than 67%, or less than 75% of a characteristic size of voids among the border phosphor particles.

Example 18. The optical element of any one of Examples 1 through 17, the pixel coating having a refractive index different from that of the border coating.

Example 19. The optical element of any one of Examples 1 through 17, the pixel coating and the border coating having the same refractive index.

Example 20. The optical element of any one of Examples 1 through 19, the pixel coating and the border coating having the same material composition.

Example 21. The optical element of Example 20, the pixel coating and the border coating comprising the same, single coating material.

Example 22. The optical element of any one of Examples 1 through 19, the pixel coating having a material composition different from that of the border coating.

Example 23. The optical element of Example 22, the pixel coating including one or more materials absent from the border coating.

Example 24. The optical element of Example 23, the pixel coating including an inner coating and an outer coating having different corresponding material compositions or refractive indices.

Example 25. The optical element of any one of Examples 1 through 24, the pixel coating or the border coating including one or more metal or semiconductor oxides.

Example 26. The optical element of any one of Examples 1 through 25, the pixel coating or the border coating including any one or more materials among $Al_2O_3$, $HfO_2$, $SiO_2$, $Ga_2O_3$, $GeO_2$, $SnO_2$, $CrO_2$, $TiO_2$, $Ta_2O_5$, $Nb_2O_5$, $V_2O_5$, $Y_2O_3$, or $ZrO_2$.

Example 27. The optical element of any one of Examples 1 through 26, the pixel coating or the border coating including one or more materials compatible with formation using an atomic layer deposition (ALD) process or using a conformal chemical vapor deposition (CVD) process.

Example 28. The optical element of any one of Examples 1 through 27, the pixel coating having a thickness greater than 0.10 μm, greater than 0.20 μm, or greater than 0.30 μm.

Example 29. The optical element of any one of Examples 1 through 28, the border coating having a non-zero thickness less than 0.15 μm, less than 0.10 μm, or less than 0.05 μm.

Example 30. The optical element of any one of Examples 6 through 13, the pixel phosphor particles being embedded in the pixel medium and the border phosphor particles being embedded in the border medium.

Example 31. The optical element of Example 30, further comprising scattering particles embedded in the border medium.

Example 32. The optical element of Example 31, the scattering particles including $TiO_2$ particles.

Example 33. The optical element of any one of Examples 30 through 32, the pixel medium including one or more polymers, or the border medium including one or more polymers.

Example 34. The optical element of Example 33, the pixel medium including one or more silicones, or the border medium including one or more silicones.

Example 35. The optical element of any one of Examples 30 through 34, the pixel medium having a material composition different from that of the border medium.

Example 36. The optical element of any one of Examples 30 through 35, the pixel medium and the border medium having the same material composition.

Example 37. The optical element of any one of Examples 30 through 36, the pixel medium having a refractive index different from that of the border medium.

Example 38. The optical element of any one of Examples 30 through 36, the pixel medium and the border medium having the same refractive index.

Example 39. The optical element of any one of Examples 1 through 38, each pixel region and border region extending from the first surface to the second surface so that each pixel region is entirely separated from adjacent pixel regions.

Example 40. The optical element of any one of Examples 1 through 38, each pixel region extending from the first surface to the second surface, each border region extending only partly from the first surface toward the second surface, each pixel region being separated from adjacent pixel regions at the first surface, and each pixel region being contiguous with one or more adjacent pixel regions at the second surface.

Example 41. The optical element of any one of Examples 1 through 40, the first and second surfaces being substantially flat.

Example 42. The optical element of any one of Examples 1 through 41, spacing of the pixel regions of the optical element being less than 1.0 mm, less than 0.50 mm, less than 0.33 mm, less than 0.20 mm, less than 0.10 mm, less than 0.08 mm, less than 0.05 mm, less than 0.033 mm, or less than 0.020 mm.

Example 43. The optical element of any one of Examples 1 through 42, width of the border regions separating adjacent pixel regions of the optical element being less than 0.10 mm, less than 0.050 mm, less than 0.033 mm, less than 0.020 mm, less than 0.010 mm, less than 0.008 mm, or less than 0.005 mm.

Example 44. A light-emitting device incorporating the wavelength-converting optical element of any one of Examples 1 through 43, the light-emitting device comprising: (A) the wavelength-converting optical element; and (B) an array of semiconductor light-emitting pixels that emit light at a first wavelength, spacing of the light-emitting pixels substantially matching spacing of the pixel regions of wavelength-converting optical element, the light-emitting pixel array being positioned so that light emitted by the light-emitting pixels enters the first surface of the material layer of the wavelength-converting optical element and is at least partly absorbed by the pixel phosphor particles and the border phosphor particles, resulting in emission from those phosphor particles of down-converted light at one or more down-converted wavelengths longer than the first wavelength, the wavelength-converting optical element being positioned so that the pixel regions thereof are substantially aligned with the light-emitting pixels of the array.

Example 45. The device of Example 44, each light-emitting pixel of the array being operable independently of at least one other light-emitting pixel of the array.

Example 46. The device of any one of Examples 44 or 45, the pixel regions exhibiting a contrast ratio for down-converted light exiting the second surface of the optical element from adjacent pixel regions thereof that is greater than 5:1, greater than 10:1, greater than 20:1, greater than 50:1, greater than 100:1, or greater than 300:1.

Example 47. The device of any one of Examples 44 through 46, the first surface of the material layer of the optical element being positioned against a light-emitting surface of the light-emitting pixel array.

Example 48. The device of any one of Examples 44 through 47, further comprising one or more transparent dielectric layers between the material layer and a light-emitting surface of the light-emitting pixel array, the first surface of the material layer being positioned against the dielectric substrate layer.

Example 49. The device of any one of Examples 44 through 48, spacing of light-emitting pixels of the array being equal to spacing of the pixel regions of the optical element.

Example 50. The device of Example 49, spacing of the light-emitting pixels of the array being less than 1.0 mm, less than 0.50 mm, less than 0.33 mm, less than 0.20 mm, less than 0.10 mm, less than 0.08 mm, less than 0.05 mm, less than 0.033 mm, or less than 0.020 mm.

Example 51. The device of any one of Examples 44 through 50, the light-emitting pixels of the array being separated by non-light-emitting pixel borders, the border regions of the optical element being aligned with the pixel borders.

Example 52. The device of Example 51, the non-light-emitting pixel borders having a non-zero width less than 0.10 mm, less than 0.050 mm, less than 0.033 mm less than 0.020 mm, less than 0.010 mm, or less than 0.005 mm.

Example 53. The device of any one of Examples 51 or 52, one or more of the border regions having equal corresponding widths equal to widths of the corresponding pixel borders.

Example 54. The device of any one of Examples 51 through 53, one or more of the border regions having corresponding widths larger than widths of the corresponding pixel borders.

Example 55. The device of any one of Examples 44 through 54, the array of semiconductor light-emitting pixels comprising an array of semiconductor light-emitting diodes (LEDs).

Example 56. The device of any one of Examples 44 through 55, the light-emitting diodes including one or more doped or undoped III-V, II-VI, or Group IV semiconductor materials or alloys or mixtures thereof.

Example 57. The device of any one of Examples 44 through 56, each light-emitting diode including one or more p-n junctions, one or more quantum wells, one or more multi-quantum wells, or one or more quantum dots.

Example 58. The device of any one of Examples 44 through 57, the light emitted by the semiconductor light-emitting pixels having a vacuum wavelength greater than 0.20 µm, greater than 0.4 µm, greater than 0.8 µm, less than 10 µm, less than 2.5 µm, or less than 1.0 µm.

Example 59. A method for making the device of any one of Examples 44 through 58, comprising positioning the optical element with the first surface thereof facing light-emitting surfaces of the light-emitting pixels of the array.

Example 60. The method of Example 59, the first surface of the optical element being positioned directly against the light-emitting surfaces.

Example 61. The method of Example 59, one or more transparent dielectric layers being positioned between the optical element and the light-emitting pixel array.

Example 62. A method for making the optical element of any one of Examples 1 through 42, the method comprising: (A) binding together with the pixel binder a corresponding plurality of pixel phosphor particles in each of the pixel regions; and (B) binding together with the border binder the plurality of border phosphor particles in the border regions, (C) the phosphor particles of the pixel regions and the boundary regions being bound together to form the material layer of the optical element.

Example 63. A method for making the optical element of any one of Examples 1 through 42, comprising: (A) forming a mask on selected areas of a substrate, leaving remaining areas of the substrate unmasked; (B) depositing pluralities of first phosphor particles onto the unmasked areas of the substrate, and binding together the deposited first phosphor particles with a first binder; (C) removing the mask from the selected areas; and (D) depositing pluralities of second phosphor particles onto the substrate between the deposited, bound pluralities of first phosphor particles, and binding together the deposited second phosphor particles, and the pluralities of second phosphor particles to the bound pluralities of first phosphor particles, with a second binder, (E) with either (i) the first phosphor particles being the pixel phosphor particles, the first binder being the pixel binder, the second phosphor particles being the border phosphor particles, and the second binder being the border binder, or (ii) the first phosphor particles being the border phosphor particles, the first binder being the border binder, the second phosphor particles being the pixel phosphor particles, and the second binder being the pixel binder.

Example 64. The method of any one of Examples 62 or 63, the substrate including one or more dielectric layers.

Example 65. The method of any one of Examples 62 through 64, the substrate including one or more semiconductor layers.

Example 66. The method of Example 65, the one or more semiconductor layers being arranged as one or more LED structures.

Example 67. The method of any one of Examples 62 through 66, further comprising removing the optical element from the substrate.

Example 68. The method of any one of Examples 62 through 67: (i) the first phosphor particles being bound together using one or more ALD processes or one or more CVD processes to form the first binder as a first coating on the first phosphor particles, or (ii) the second phosphor particles being bound together using one or more ALD processes or one or more CVD processes to form the second binder as a second coating on the second phosphor particles.

Example 69. The method of Example 68, the second coating being formed on the bound first phosphor particles over the first coating.

Example 70. The method of any one of Examples 68 or 69, further comprising, before forming the mask, forming a protection layer on the substrate, the protection layer being less reactive than the substrate with respect to one or more reagents employed for the one or more ALD process or the one or more CVD processes.

Example 71. The method of any one of Examples 62 through 67: (i) the first phosphor particles being bound together using deposition of one or more precursors and curing the one or more precursors to form the first binder as a first transparent solid medium embedding the first phosphor particles, or (ii) the second phosphor particles being bound together using deposition of one or more precursors and curing the one or more precursors to form the second binder as a second transparent solid medium embedding the second phosphor particles.

Example 72. The method of any one of Examples 63 through 71, further comprising, before removing the mask, removing from masked areas any first phosphor particles deposited on the mask material.

Example 73. The method of any one of Examples 63 through 72, further comprising removing from the deposited, bound pluralities of the first phosphor particles any second phosphor particles thereon.

Example 74. The method of any one of Examples 63 through 72, any second phosphor particles deposited and bound on the deposited, bound pluralities of the first phosphor particles being left in place, so that the bound pluralities of the first phosphor particles are covered by the bound second phosphor particles.

This disclosure is illustrative and not limiting. Further modifications will be apparent to one skilled in the art in light of the present disclosure and are intended to fall within the scope of the present disclosure or appended claims. It is intended that equivalents of the disclosed example embodiments and methods, or modifications thereof, shall fall within the scope of the present disclosure or appended claims.

In the foregoing Detailed Description, various features may be grouped together in several example embodiments for the purpose of streamlining the disclosure. This method of disclosure is not to be interpreted as reflecting an intention that any claimed embodiment requires more features than are expressly recited in the corresponding claim. Rather, as the appended claims reflect, inventive subject matter may lie in less than all features of a single disclosed example embodiment. Therefore, the present disclosure shall be construed as implicitly disclosing any embodiment having any suitable subset of one or more features—which features are shown, described, or claimed in the present application—including those subsets that may not be explicitly disclosed herein. A "suitable" subset of features includes only features that are neither incompatible nor mutually exclusive with respect to any other feature of that subset. Accordingly, the appended claims are hereby incorporated in their entirety into the Detailed Description, with each claim standing on its own as a separate disclosed embodiment. In addition, each of the appended dependent claims shall be interpreted, only for purposes of disclosure by said incorporation of the claims into the Detailed Description, as if written in multiple dependent form and dependent upon all preceding claims with which it is not inconsistent. It should be further noted that the cumulative scope of the appended claims can, but does not necessarily, encompass the whole of the subject matter disclosed in the present application.

The following interpretations shall apply for purposes of the present disclosure and appended claims. The words "comprising," "including," "having," and variants thereof, wherever they appear, shall be construed as open ended terminology, with the same meaning as if a phrase such as "at least" were appended after each instance thereof, unless explicitly stated otherwise. The article "a" shall be interpreted as "one or more" unless "only one," "a single," or other similar limitation is stated explicitly or is implicit in the particular context; similarly, the article "the" shall be interpreted as "one or more of the" unless "only one of the," "a single one of the," or other similar limitation is stated explicitly or is implicit in the particular context. The conjunction "or" is to be construed inclusively unless: (i) it is explicitly stated otherwise, e.g., by use of "either . . . or," "only one of," or similar language; or (ii) two or more of the listed alternatives are understood or disclosed (implicitly or explicitly) to be incompatible or mutually exclusive within the particular context. In that latter case, "or" would be understood to encompass only those combinations involving non-mutually-exclusive alternatives. In one example, each of "a dog or a cat," "one or more of a dog or a cat," and "one or more dogs or cats" would be interpreted as one or more dogs without any cats, or one or more cats without any dogs, or one or more of each. In another example, each of "a dog, a cat, or a mouse," "one or more of a dog, a cat, or a mouse," and "one or more dogs, cats, or mice" would be interpreted as (i) one or more dogs without any cats or mice, (ii) one or more cats without and dogs or mice, (iii) one or more mice without any dogs or cats, (iv) one or more dogs and one or more cats without any mice, (v) one or more dogs and one or more mice without any cats, (vi) one or more cats and one or more mice without any dogs, or (vii) one or more dogs, one or more cats, and one or more mice. In another example, each of "two or more of a dog, a cat, or a mouse" or "two or more dogs, cats, or mice" would be interpreted as (i) one or more dogs and one or more cats without any mice, (ii) one or more dogs and one or more mice without any cats, (iii) one or more cats and one or more mice without and dogs, or (iv) one or more dogs, one or more cats, and one or more mice; "three or more," "four or more," and so on would be analogously interpreted.

For purposes of the present disclosure or appended claims, when a numerical quantity is recited (with or without terms such as "about equal to," "substantially equal to," "greater than about," "less than about," and so forth), standard conventions pertaining to measurement precision and significant digits shall apply, unless a differing interpretation is explicitly set forth. For null quantities described by phrases such as "substantially prevented," "substantially absent," "substantially eliminated," "about equal to zero," "negligible," and so forth, each such phrase shall denote the case wherein the quantity in question has been reduced or diminished to such an extent that, for practical purposes in the context of the intended operation or use of the disclosed or claimed apparatus or method, the overall behavior or performance of the apparatus or method does not differ from that which would have occurred had the null quantity in fact been completely removed, exactly equal to zero, or otherwise exactly nulled.

For purposes of the present disclosure and appended claims, any labelling of elements, steps, limitations, or other portions of an embodiment, example, or claim (e.g., first, second, third, etc., (a), (b), (c), etc., or (i), (ii), (iii), etc.) is only for purposes of clarity, and shall not be construed as implying any sort of ordering or precedence of the portions so labelled. If any such ordering or precedence is intended, it will be explicitly recited in the embodiment, example, or claim or, in some instances, it will be implicit or inherent based on the specific content of the embodiment, example, or claim. In the appended claims, if the provisions of 35 USC § 112(f) are desired to be invoked in an apparatus claim, then the word "means" will appear in that apparatus claim. If those provisions are desired to be invoked in a method claim, the words "a step for" will appear in that method claim. Conversely, if the words "means" or "a step for" do not appear in a claim, then the provisions of 35 USC § 112(f) are not intended to be invoked for that claim.

If any one or more disclosures are incorporated herein by reference and such incorporated disclosures conflict in part or whole with, or differ in scope from, the present disclosure, then to the extent of conflict, broader disclosure, or broader definition of terms, the present disclosure controls. If such incorporated disclosures conflict in part or whole with one another, then to the extent of conflict, the later-dated disclosure controls.

The Abstract is provided as required as an aid to those searching for specific subject matter within the patent literature. However, the Abstract is not intended to imply that any elements, features, or limitations recited therein are necessarily encompassed by any particular claim. The scope of subject matter encompassed by each claim shall be determined by the recitation of only that claim.

What is claimed is:

1. A light-emitting device comprising:
a wavelength-converting optical element; and
an array comprising a plurality of microLEDs and non-light-emitting areas separating adjacent microLEDs,
wherein the wavelength-converting optical element is arranged as a solid wavelength-converting layer disposed on the array and comprises:
a plurality of first regions aligned with the plurality of microLEDs and comprising phosphor particles of a first characteristic size dispersed in, or bound together with, a first transparent material; and
a second region contiguous with the first regions, aligned with the non-light-emitting areas, and comprising phosphor particles of a second characteristic size dispersed in, or bound together with, a second transparent material, wherein the second region exhibits optical scattering greater than optical scattering exhibited by the first regions.

2. The light-emitting device of claim 1, wherein the first characteristic size differs from the second characteristic size.

3. The light-emitting device of claim 1, wherein the second characteristic size is less than 50% of the first characteristic size.

4. The light-emitting device of claim 1, wherein the first characteristic size is less than 10 μm, or the second characteristic size is less than 5 μm.

5. The light-emitting device of claim 1, wherein spacing of the microLEDs of the array is less than 0.10 mm, or width of the non-light-emitting areas separating adjacent microLEDs of the array is less than 0.010 mm.

6. The light-emitting device of claim 1, wherein: (i) the first regions comprise the phosphor particles of the first characteristic size embedded in the first transparent material, the first transparent material forming a first solid medium, and (ii) the second region comprises the phosphor particles of the second characteristic size embedded in the second transparent material, the second transparent material forming a second solid medium.

7. The light-emitting device of claim 6, wherein the first regions differ from the second region with respect to compositions or refractive indices characterizing the first solid medium and the second solid medium.

8. The light-emitting device of claim 6 further comprising scattering particles embedded in the second solid medium.

9. The light-emitting device of claim 6, wherein the first solid medium includes one or more polymers, or the second solid medium includes one or more polymers.

10. The light-emitting device of claim 6, wherein the first solid medium includes one or more silicones, and the second solid medium includes one or more silicones.

11. The light-emitting device of claim 6, wherein the first and second solid media have the same material composition.

12. The light-emitting device of claim 1, wherein: (i) the first regions comprise the phosphor particles of the first characteristic size and a first coating on the phosphor particles of the first regions that binds together the phosphor particles of the first regions, the first coating comprising the first transparent material, and (ii) the second region comprises the phosphor particles of the second characteristic size and a second coating on the phosphor particles of the second region that binds together the phosphor particles of the second region, the second coating comprising the second transparent material.

13. The light-emitting device of claim 12, wherein the first regions differ from the second region with respect to size, number density, or volume fraction characterizing voids among the phosphor particles of the first regions and voids among the phosphor particles of the second region.

14. The light-emitting device of claim 12, wherein the first regions differ from the second region with respect to thicknesses, compositions, or refractive indices characterizing the first coating and the second coating.

15. The light-emitting device of claim 12, wherein the first coating has a thickness greater than 0.20 μm, or the second coating has a non-zero thickness less than 0.10 μm.

16. The light-emitting device of claim 12, wherein the first coating includes one or more metal or semiconductor oxides, and the second coating includes one or more metal or semiconductor oxides.

17. The light-emitting device of claim 12, wherein the first and second coatings have the same material composition.

18. The light-emitting device of claim 12, wherein the first coating or the second coating includes one or more materials compatible with formation using an atomic layer deposition (ALD) process or using a conformal chemical vapor deposition (CVD) process.

19. The light-emitting device of claim 12, wherein: (i) the second coating has a characteristic thickness that is less than 50% of a characteristic thickness of the first coating, or (ii) number density or volume fraction of voids among the phosphor particles of the first regions is less than 50% of number density or volume fraction of voids among the phosphor particles of the second region.

20. The light-emitting device of claim 1, wherein the first regions exhibit a contrast ratio for down-converted light exiting the wavelength-converting layer from adjacent first regions thereof that is greater than 5:1, the down-converted light resulting from absorption of light emitted by the microLEDs and subsequent emission of the down-converted light at a wavelength longer than a wavelength of the light emitted by the microLEDs.

* * * * *